US012740258B2

(12) United States Patent
Choi et al.

(10) Patent No.: US 12,740,258 B2
(45) Date of Patent: Sep. 15, 2026

(54) DISPLAY DEVICE INCLUDING AN OXIDE SEMICONDUCTOR PATTERN

(71) Applicant: LG Display Co., Ltd., Seoul (KR)

(72) Inventors: Sung Ju Choi, Paju-si (KR); Jae Yoon Park, Paju-si (KR); Jung Seok Seo, Paju-si (KR); Seo Yeon Im, Paju-si (KR); Jin Won Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 448 days.

(21) Appl. No.: 18/457,093

(22) Filed: Aug. 28, 2023

(65) Prior Publication Data

US 2024/0090278 A1 Mar. 14, 2024

(30) Foreign Application Priority Data

Sep. 8, 2022 (KR) ........................ 10-2022-0114096

(51) Int. Cl.
*H10K 59/126* (2023.01)
*H01L 29/786* (2006.01)
(Continued)

(52) U.S. Cl.
CPC ....... *H10K 59/126* (2023.02); *H10D 30/6723* (2025.01); *H10D 30/6733* (2025.01);
(Continued)

(58) Field of Classification Search
CPC .. H10K 50/865; H10K 59/125; H10K 59/126; H10K 59/1213; H10K 59/8792; H10D 30/6723; H10D 30/6745; H10D 30/6755; H10D 86/40; H10D 86/423; H10D 86/60; H10D 86/67
See application file for complete search history.

(56) References Cited

U.S. PATENT DOCUMENTS

2014/0183476 A1 7/2014 Kwon et al.
2015/0123084 A1 5/2015 Kim et al.
(Continued)

FOREIGN PATENT DOCUMENTS

KR 10-2014-0085305 A 7/2014
KR 10-2015-0051824 A 5/2015
(Continued)

OTHER PUBLICATIONS

Ministry of Intellectual Property of Korea, Office Action, Korean Patent Application No. 10-2022-0114096, Apr. 26, 2026, 55 pages.

*Primary Examiner* — David C Spalla
(74) *Attorney, Agent, or Firm* — Fenwick & West LLP

(57) ABSTRACT

The disclosure relates to a display device including an oxide semiconductor pattern. The disclosure provides a driving thin film transistor and a switching thin film transistor using an oxide semiconductor pattern as an active layer. Each of the driving thin film transistor and the switching thin film transistor includes a light shielding pattern. The light shielding pattern includes a semiconductor material layer doped with P-type impurity ions. By virtue of the light shielding pattern including the semiconductor material layer, each of the driving thin film transistor and the switching thin film transistor exhibits an increase in threshold voltage and, as such, freedom of circuit design is secured.

16 Claims, 14 Drawing Sheets

(51) Int. Cl.
*H10D 30/67* (2025.01)
*H10K 59/121* (2023.01)

(52) U.S. Cl.
CPC ..... *H10D 30/6745* (2025.01); *H10D 30/6755* (2025.01); *H10K 59/1213* (2023.02)

(56) References Cited

U.S. PATENT DOCUMENTS

| | | | | |
|---|---|---|---|---|
| 2017/0155000 | A1 | 6/2017 | Moon et al. | |
| 2021/0066421 | A1 | 3/2021 | Son et al. | |
| 2021/0202634 | A1 | 7/2021 | Moon et al. | |
| 2022/0020837 | A1 | 1/2022 | Kim et al. | |
| 2022/0310855 | A1* | 9/2022 | Tsubuku | H10F 77/933 |
| 2022/0416001 | A1* | 12/2022 | Kim | H10D 86/60 |
| 2023/0238389 | A1* | 7/2023 | Gong | H10D 86/471<br>257/43 |
| 2024/0121998 | A1* | 4/2024 | Lee | H10D 86/60 |

FOREIGN PATENT DOCUMENTS

| | | | |
|---|---|---|---|
| KR | 10-2017-0061776 | A | 6/2017 |
| KR | 10-2020-0020327 | A | 2/2020 |
| KR | 10-2021-0027654 | A | 3/2021 |
| KR | 10-2021-0085748 | A | 7/2021 |
| KR | 10-2021-0086247 | A | 7/2021 |
| KR | 10-2022-0010622 | A | 1/2022 |

* cited by examiner

160
110
150
120
DATA,DDC
140
GL1
DL1
DLn
GDC
100
SP
130
AA
180
EVDD
EVSS
GLm
NA

FIG. 2

FIG. 4A 470 473 472 471 460 463 461 462 456 455 457 PLN2 PLN1 430 447 446 445 444 443 411 410

Figure 4A:
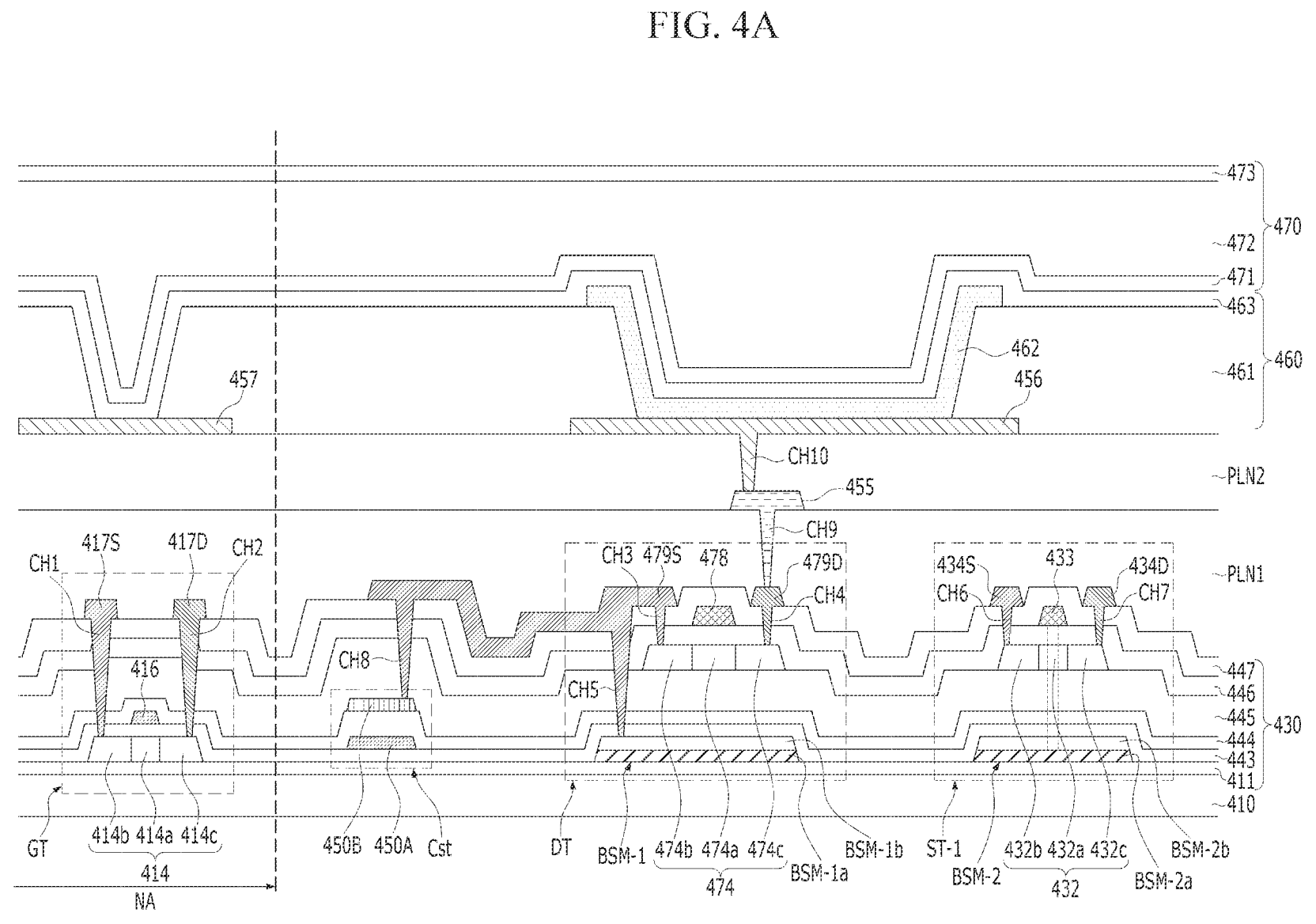

434D CH7 433 434S CH6 432 432a 432b 432c BSM-2 BSM-2a BSM-2b ST-1

479D CH4 CH9 CH10 478 479S CH3 CH5 474 474a 474b 474c BSM-1 BSM-1a BSM-1b DT

CH8 450A 450B Cst

473
470
472
471
463
460
461
PLN2
PLN1
447
446
445
444
443
411
410
430
434D
CH7
433
432b
432a
432c
432
BSM-2b
434S
CH6
BSM-2
ST-1
462
456
455
CH10
CH9
479D
CH4
478
474b
474a
474c
474
BSM-1c
479S
CH3
CH5
BSM-1
DT
CH8
450B
450A
Cst
457
CH2
417D
416
414b
414a
414c
414
417S
CH1
GT
NA

DISPLAY DEVICE INCLUDING AN OXIDE SEMICONDUCTOR PATTERN

CROSS-REFERENCE TO RELATED APPLICATION

This application claims the benefit of Republic of Korea Patent Application No. 10-2022-0114096, filed on Sep. 8, 2022, which is hereby incorporated by reference in its entirety.

BACKGROUND

Field of the Disclosure

The present disclosure relates to a display device including an oxide semiconductor pattern, and more particularly to a display device in which a thin film transistor disposed on a substrate may achieve low-grayscale expression, blockage of leakage current, and an increase in threshold voltage. In particular, the present disclosure relates to a display device capable of realizing grayscale expression in a wide range and a rapid on/off operation through an increase in s-factor of a thin film transistor thereof.

Discussion of the Related Art

Recently, in accordance with advances in multimedia, the importance of a flat display device has increased. To cope with such a situation, flat display devices such as a liquid crystal display device, a plasma display device, an organic light emitting display device, etc. are being commercialized. Among such flat display devices, the organic light emitting display device is currently mainly used in that the display device has fast response time, high luminance, and a wide viewing angle.

In such an organic light emitting device, a plurality of pixels is disposed in a matrix, and each of the pixels includes a light emitting element part represented by an organic light emitting layer and a pixel circuit part represented by a thin film transistor. The pixel circuit part includes a driving thin film transistor (driving TFT) configured to operate an organic light emitting element through supply of drive current and a switching thin film transistor (switching TFT) configured to supply a gate signal to the driving TFT.

In addition, a gate driving circuit part configured to provide a gate signal to each pixel may be disposed in a non-display area of the organic light emitting display device.

SUMMARY

The present disclosure relates to a display device including a thin film transistor disposed at a pixel, in particular, a pixel circuit part of a sub-pixel, and configured to block leakage current in an off state, and including a thin film transistor configured to achieve free grayscale expression at low gray levels.

Accordingly, the present disclosure is directed to a display device including an oxide semiconductor pattern that substantially obviates one or more problems due to limitations and disadvantages of the related art.

An object of the present disclosure is to provide a display device including a thin film transistor disposed within a pixel and configured to exhibit a high effect of blocking leakage current in an off state and to secure a threshold voltage not lower than a target value, and a thin film transistor configured to achieve free grayscale expression at low gray levels while using an oxide semiconductor pattern having an increased s-factor value as an active layer.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a substrate including a display area and a non-display area disposed around the display area, an upper buffer layer disposed on the substrate while including at least one inorganic insulating layer, a first transistor disposed on the upper buffer layer while including a first semiconductor pattern and a first gate electrode disposed on the first semiconductor pattern, and a first light shielding pattern disposed between the substrate and the first transistor while including a metal layer or P-type impurity ions.

The display device may further include a second transistor including a second oxide semiconductor pattern disposed on the upper buffer layer, a second gate electrode disposed on the second oxide semiconductor pattern while overlapping with the second oxide semiconductor pattern, and a second source electrode and a second drain electrode electrically connected to the second oxide semiconductor pattern, and a second light shielding pattern disposed under the second oxide semiconductor pattern while overlapping with the second oxide semiconductor pattern and including a metal layer or P-type impurity ions.

Objects of the present disclosure are not limited to the above-described objects, and other objects of the present disclosure not yet described will be more clearly understood by those skilled in the art from the following detailed description.

BRIEF DESCRIPTION OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings:

FIG. 1 is a schematic block diagram of a display device according to an exemplary embodiment of the present disclosure;

FIG. 2 is a circuit diagram of one sub-pixel of the display device according to the exemplary embodiment of the disclosure;

FIG. 4A is a cross-sectional view showing various thin film transistors and a storage capacitor in a display device according to an exemplary embodiment of the present disclosure;

FIG. 4B is a circuit diagram showing a relationship between parasitic capacitances generated within a driving thin film transistor according to an exemplary embodiment of the present disclosure;

FIG. 6 is a cross-sectional view showing a display device according to another exemplary embodiment of the present disclosure;

FIG. 7 is a cross-sectional view showing a display device according to another exemplary embodiment of the present disclosure;

FIG. 8 is a cross-sectional view showing a display device according to another exemplary embodiment of the present disclosure;

FIG. 9 is a cross-sectional view showing a display device according to another exemplary embodiment of the present disclosure;

FIG. 10 is a cross-sectional view showing a display device according to another exemplary embodiment of the present disclosure;

FIG. 11 is a cross-sectional view showing a display device according to another exemplary embodiment of the present disclosure;

DETAILED DESCRIPTION

Figure 3:
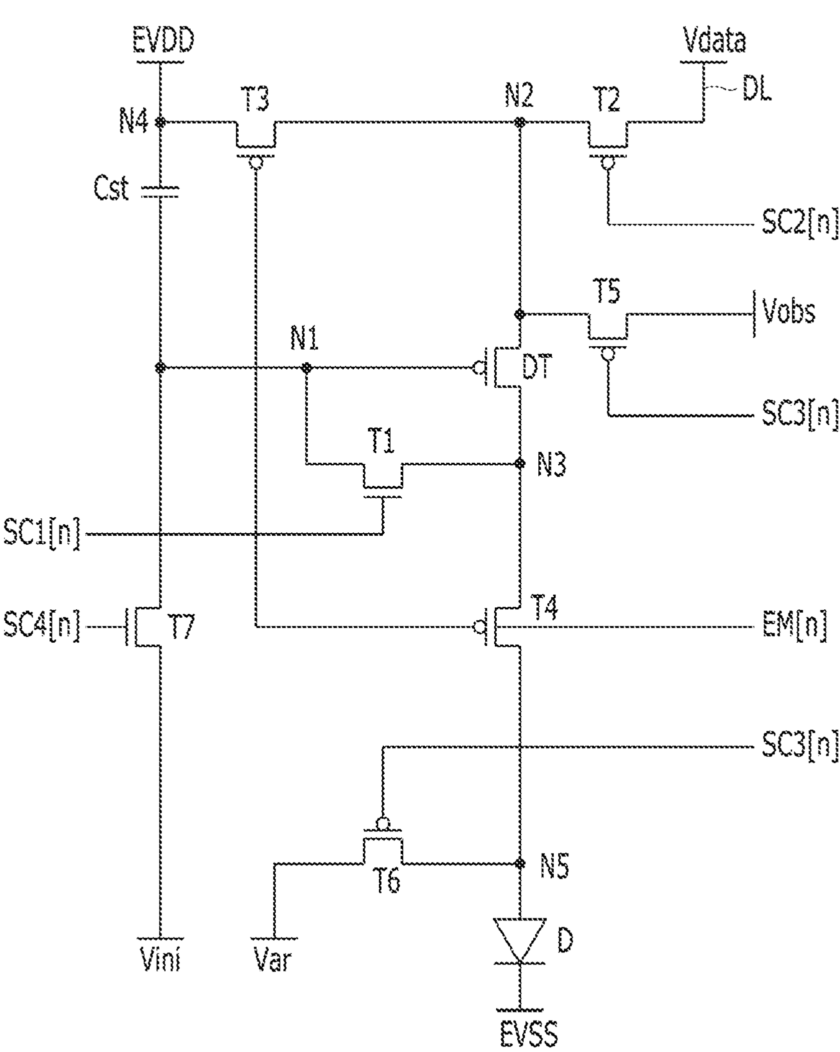
FIG. 3 is a circuit diagram of one sub-pixel of a display device according to another exemplary embodiment of the present disclosure.

Advantages and features of the present disclosure and methods for achieving the same will be made clear from embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete, and will fully convey the scope of the disclosure to those skilled in the art.

In the drawings for explaining the exemplary embodiments of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises," "includes," and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on", "above", "below", "next to", or the like, one or more other parts may be located between the two parts unless the term "directly" or "closely" is used.

In the description of the various embodiments of the present disclosure, when describing temporal relationships, for example, when the temporal relationship between two actions is described using "after", "subsequently", "next", "before", or the like, the actions may not occur in succession unless the term "directly" or "just" is used therewith.

It may be understood that, although the terms "first", "second", etc. may be used herein to describe various elements, these elements are not to be limited by these terms. These terms are merely used to distinguish one element from another. Therefore, in the present specification, an element indicated by "first" may be the same as an element indicated by "second" without exceeding the technical scope of the present disclosure, unless otherwise mentioned.

The respective features of the various embodiments of the present disclosure may be partially or entirely coupled to and combined with each other, and various technical linkages and modes of operation thereof are possible. These various embodiments may be performed independently of each other, or may be performed in association with each other.

Hereinafter, display devices according to exemplary embodiments of the present disclosure will be described in detail with reference to the accompanying drawings.

Figure 1:
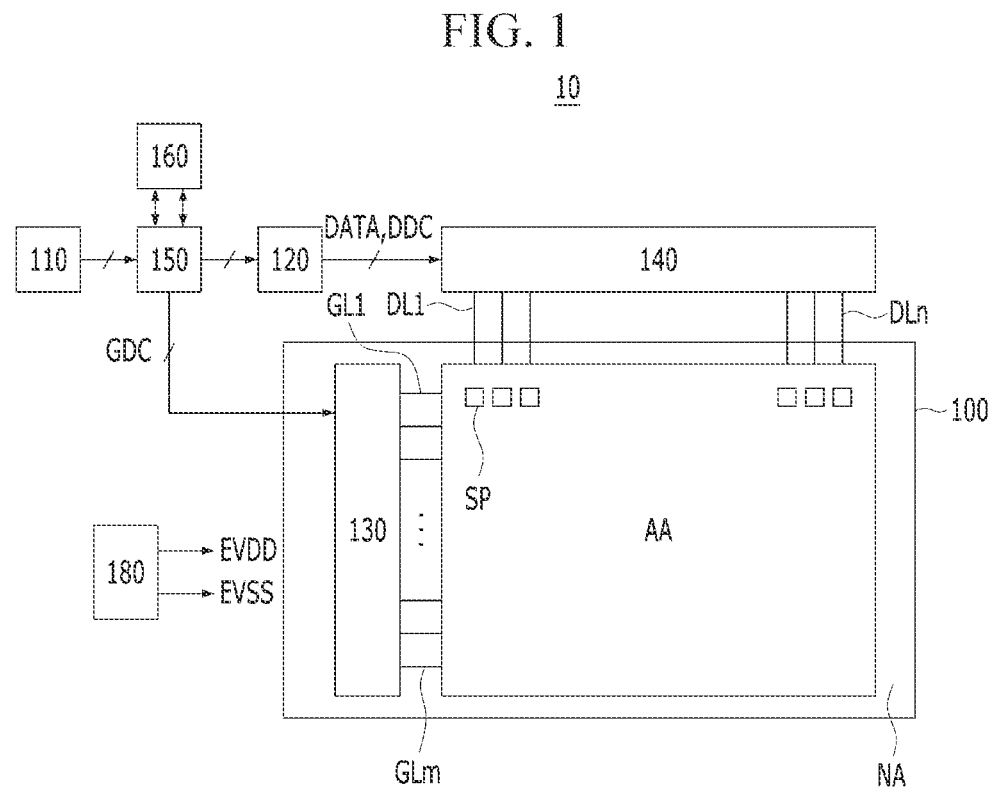

FIG. 1 is a schematic block diagram of a display device according to an exemplary embodiment of the present disclosure.

As shown in FIG. 1, the display device, which is designated by reference numeral "10", includes a display panel 100 formed with an image processor 110, a degradation compensator 150, a memory 160, a timing controller 120, a data driver 140, a power supply 180, and a gate driver 130. In particular, a non-display area NA of the display panel 100 includes a bending area. The display panel 100 may be folded in the bending area and, as such, may reduce a bezel.

The image processor 110 (e.g., a circuit) outputs drive signals for driving various devices, together with image data supplied from an exterior thereof.

The degradation compensator 150 (e.g., a circuit) modulates input image data of each sub-pixel SP of a current frame based on a sensing voltage supplied from the data driver 140, and then supplies the modulated image data to the timing controller 120.

The timing controller 120 generates and outputs a gate timing control signal) C for control of operation timing of the gate driver 130 and a data timing control signal DDC for control of operation Liming of the data driver 140 based on a drive signal input frog the image processor 110 thereto.

The gate driver 130 outputs a scan signal to the display panel 100 in response to the gate timing control signal GDC supplied from the timing controller 120, The gate driver 130 outputs the scan signal through a plurality gate lines GL1 to GLm. In particular, the gate driver 130 may be configured to have a gate-in-panel (CHF) structure in which a thin film transistor is stacked on a substrate of the display panel 100. The GIP may include a plurality of circuits such as a shift register, a level shifter, etc.

The data driver 140 outputs a data voltage to the display panel 100 in response to the data timing control signal DDC input frons the timing controller 120 thereto. The data driver 140 outputs the data voltage through a plurality of data lines DL1 to DLn.

The power supply 180 outputs a high-level drive voltage EVDD, a low-level drive voltage EVSS, etc., and supplies the output voltages EVDD, EVSS, etc. to the display panel 100. The high-level drive voltage EVDD and the low-level drive voltage EVSS are supplied to the display panel 100 through power les.

The display panel 100 displays an image, corresponding to the data voltage and the scan signal respectively supplied from the data driver 140 and the gate driver 130, which may be disposed in the non-display area NA, and power supplied from the power supply 180.

A display area AA of the display panel 100 is constituted by a plurality of sub-pixels SP and, as such, displays an actual image. The sub-pixels SP include a red (R) sub-pixel, a green (G) sub-pixel, and a blue (B) sub-pixel, or include a white (W) sub-pixel, a red (R) sub-pixel, a green (G) sub-pixel, and a blue (B) sub-pixel. In this case, the W, R, G, and B sub-pixels SP may be formed to have the same area or may be formed to have different areas, respectively.

The memory 160 not only stores a look-up table for degradation compensation gains, but also stores a degradation compensation time point of an organic light emitting element of each sub-pixel SP. In this case, the degradation compensation time point of the organic light emitting element may be the number of times when the display, panel 100 is driven or the time for which the display panel 100 is driven.

Meanwhile, each sub-pixel SP may be connected the one gate line, for example, the gate line GL1, one data line, for example, the data line DL1, one sensing voltage read-out line, for example, a sensing voltage read-out line SRL1 and one power line, for example, a power line PL1. The numbers of transistors and capacitors of the sub-pixel SP and the driving method of the sub-pixel SP are determined in accordance with a circuit configuration of the sub-pixel SP.

Figure 2:
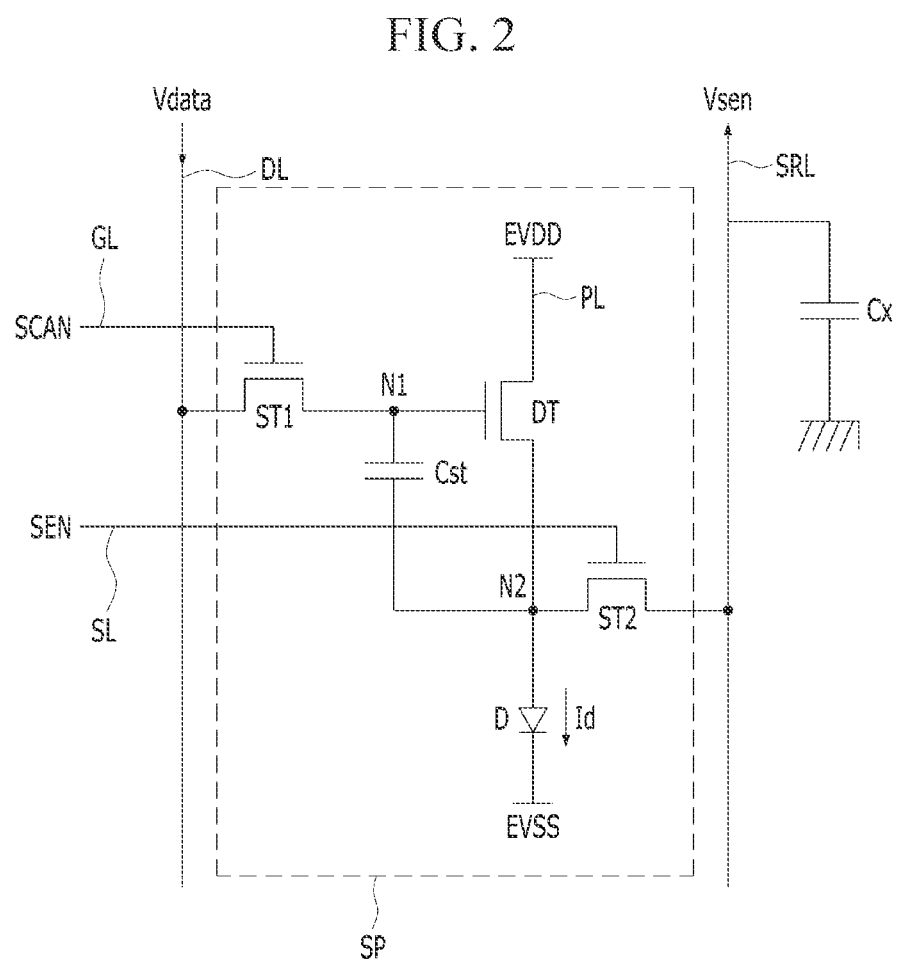

FIG. 2 is a circuit diagram of one sub-pixel of the display device according to the exemplary embodiment of the disclosure.

As shown in FIG. 2, the display device 100 according to the exemplary embodiment of the disclosure includes a gate line GL, a data line DL, a power line PL, and a sensing line SL intersecting one another, thereby defining a sub-pixel SP, and includes a driving thin film transistor DT, a light emitting element D, a storage capacitor Cst, a first switching thin film transistor ST1, and a second switching thin film transistor ST2 at the sub-pixel SP.

The light emitting element D may include an anode connected to a second node N2, a cathode connected to an input terminal for a low-level drive voltage EVSS, and an organic light emitting layer disposed between the anode and the cathode.

The driving thin film transistor DT controls current Id flowing through the light emitting element D in accordance with a gate-source voltage Vgs thereof. The driving thin film transistor DT includes a gate electrode connected to a first node N1, a drain electrode connected to the power line PL, to receive a high-level drive voltage EVDD, and a source electrode connected to the second node N2.

The storage capacitor Cst is connected between the first node N1 and the second node N2.

When the display panel 100 is driven, the first switching thin film transistor ST1 applies a data voltage Vdata charged in the data line, DL to the first node N1 in response to a gate signal SCAN, thereby turning on the driving thin film transistor DT. In this case, the first switching thin transistor ST1 includes a gate electrode connected to the gate line GL, to receive the gate signal SCAN, a drain electrode connected to the data line DL, to receive the data voltage Vdata, and a source electrode connected to the first node N1. The first switching thin film transistor ST1 is known as more sensitively operating than other switching thin film transistors in the pixel. To this end, it is necessary to increase a threshold voltage of the first switching thin film transistor ST1, for easy control of the first switching thin film transistor ST1.

The second switching thin film transistor ST2 stores a source voltage of the second node N2 in a sensing capacitor Cx of the sensing voltage read-out line SRI, by switching current between the second node N2 and the sensing voltage read-out line SRL, in response to a sensing signal SEN. The second switching thin film transistor ST2 resets a source voltage of the driving thin film transistor DT to an initialization voltage Vsen by switching current between the second node N2 and the sensing voltage read-out line SRL in response to the sensing signal SEN when the display panel 100 is driven. In this case, in the second switching thin film transistor ST2, a gate electrode thereof is connected to the sensing line SL, a drain electrode thereof is connected to the second node N2, and a source electrode thereof is connected to the sensing voltage read-out line SRL.

FIG. 3 is a circuit diagram of one sub-pixel of a display device according to another exemplary embodiment of the present disclosure.

FIG. 3 only illustrates a pixel circuit, for description of a pixel circuit configuration according to an exemplary embodiment of the present disclosure, and any pixel circuit structure may be used, so long as the pixel circuit structure may control light emission of a light emitting element D in accordance with application of an emission signal EM[n]. For example, the pixel circuit may include an additional scan signal, a switching thin film transistor connected to the additional scan signal, and a switching thin film transistor to which an additional initialization voltage: is applied, and connection relations of the switching elements and a connection position of a capacitor may be diversely varied. In the following description, the display device having the pixel circuit structure of FIG. 3 will be described, for convenience of description.

Referring to FIG. 3, each of a plurality of sub-pixels SP may include a pixel circuit including a driving transistor DT, and a light emitting element D connected to the pixel circuit.

The pixel circuit may drive the light emitting element D by controlling a drive current flowing through the light emitting element D. The pixel circuit may include the driving transistor DT, first to seventh transistors T1 to T7, and a capacitor Cst. Each of the transistors DT and T1 to T7 may include a first electrode, a second electrode, and a gate electrode. One of the first and second electrodes may be a source electrode, and the other of the first and second electrodes may be a drain electrode.

Each of the transistors DT and T1 to T7 may be a P-type thin film transistor or an N-type thin film transistor. In the embodiment of FIG. 3, each of the first transistor T1 and the seventh transistor T7 is constituted by an N-type thin film transistor, and each of the remaining transistors DT and T2 to T6 is constituted by a P-type thin film transistor. Of course, the exemplary embodiments of the present disclosure are not limited to the above-described configuration, and the entirety or a part of the transistors DT and T1 to T7 may be P-type thin film transistors or N-type thin film transistors in accordance with an embodiment. In addition, the N-type thin film transistor may be an oxide thin film transistor, and the P-type thin film transistor may be a polysilicon thin film transistor.

The following description will be given in conjunction with an example in which each of the first transistor T1 and the seventh transistor T7 is an N-type thin film transistor, and each of the remaining transistors DT and T2 to T6 is a P-type thin film transistor. Accordingly, each of the first transistor T1 and the seventh transistor T7 is turned on in accordance with application of a high-level voltage thereto, and each of the remaining transistors DT and T2 to T6 is turned on in accordance with application of a low-level voltage thereto.

In an example, among the transistors constituting the pixel circuit, the first transistor T1 may function as a compensation transistor, the second transistor T2 may function as a data supply transistor, each of the third and fourth transistors T3 and T4 may function as an emission control transistor, the fifth transistor T5 may function as a bias transistor, and each of the sixth and seventh transistors T6 and T7 may function as an initialization transistor.

The light emitting element D may include an anode (or a pixel electrode) and a cathode. The anode of the light emitting element D may be connected to a fifth node N5, and the cathode of the light emitting element D may be connected to a low-level drive voltage EVSS.

The driving transistor DT may include a first electrode connected to a second node N2, a second electrode connected to a third node N3, and a gate electrode connected to a first node N1. The driving transistor DT may supply a drive current to the light emitting element 1) based on a voltage of the first node N1 (or a data voltage stored in the capacitor Cst, as will be described later).

The first transistor T1 may include a first electrode connected to the first node N1, a second electrode connected to the third node N3, and a gate electrode configured to receive a first scan signal SC1[*n*] The first transistor T1 may be turned on in response to the first scan signal SC1 and, as such, may be diode-connected between the first node N1 and the third node N3. Accordingly, the first transistor T1 may sample a threshold voltage Vth of the driving transistor DT. The first transistor T1 configured as described above may be a compensation transistor.

The capacitor Cst may be connected or formed between the first node N1 and a fourth node N4. The capacitor Cst stores or maintains a high-level drive voltage EVDD supplied thereto.

The second transistor T2 may include a first electrode connected to a data line DL (or configured to receive a data voltage Vdata), a second electrode connected to the second node N2, and a gate electrode configured to receive a second scan signal SC2[*n*]. The second transistor T2 may be turned on in response to the second scan signal SC2[*n*] and, as such, may transmit the data voltage Vdata to the second node N2. The second transistor T2 configured as described above may be a data supply transistor.

The third transistor T3 and the fourth transistor T4 (or first and second emission control transistors) may be connected between the high-level drive voltage EVDD and the light emitting element D, and may form a current flow path through which a drive current generated by the drive transistor DT flows.

The third transistor T3 may include a first electrode connected to the fourth node N4, to receive the high-level drive voltage EVDD, a second electrode connected to the second node N2, and a gate electrode configured to receive an emission control signal EM[n].

The fourth transistor T4 may include, a first electrode connected to the third node N3, a second electrode connected to the fifth node N5 (or the anode of the light emitting element D), and a gate electrode configured to receive the emission control signal EM[n].

The third and fourth transistors T3 and T4 may be turned on in response to the emission control signal EM[n] and, as such, a drive current is supplied to the light emitting element D. Accordingly, the light emitting element D may emit light at a luminance corresponding to the drive current.

The fifth transistor T5 may include a first electrode configured to receive a bias voltage Vobs, a second electrode connected to the second node N2, and a gate electrode configured to receive a third scan signal SC3[*n*]. The fifth transistor T5 configured as described above may be a bias transistor.

The sixth transistor T6 may include a first electrode configured to receive a first initialization voltage Var, a second electrode connected to the fifth node N5, and a gate electrode configured to receive the third scan signal SC3[*n*].

The sixth transistor T6 may be turned on in response to the third scan signal SC3[*n*] before the light emitting element D emits light (or after the light emitting element D emits light) and, as such, may initialize the anode (or the pixel electrode) of the light emitting element D using the first initialization voltage Var. The light emitting element D may have a parasitic capacitor formed between the anode and the cathode thereof. The parasitic capacitor may be charged during light emission of the light emitting element D and, as such, the anode of the light emitting element D may have a specific voltage. Accordingly, it may be possible to initialize an amount of charge accumulated in the light emitting element D by applying the first initialization voltage Var to the anode of the light emitting element D via the sixth transistor T6.

In the exemplary embodiment of the present disclosure, the gate electrodes of the fifth and sixth transistors T5 and T6 are configured to receive the third scan signal SC3[*n*] in common. However, the exemplary embodiment of the present disclosure is not limited to the above-described configuration, and the gate electrodes of the fifth and sixth transistors T5 and T6 may be configured to receive separate scan signals, respectively, and, as such, to be independently controlled.

The seventh transistor T7 may include a first electrode configured to receive a second initialization voltage Vini, a second electrode connected to the first node N1, and a gate electrode configured to receive a fourth scan signal SC41*n*1.

The seventh transistor T7 may be turned on in response to the fourth scan signal SC4[*n*] and, as such, may initialize the gate electrode of the driving transistor DT using the second initialization voltage Vini. Unnecessary charges may remain at the gate electrode of the driving transistor DT due to the high-level drive voltage EVDD stored in the capacitor Cst. Accordingly, it may be possible to initialize the remaining amount of charges by applying the second initialization voltage Vini to the gate electrode of the driving transistor DT via the seventh transistor T7.

Meanwhile, although the display devices respectively having a 3T1C structure including three thin film transistors and one storage capacitor and an 8T1C structure including 8 thin film transistors and one storage capacitor have been illustrated and described with reference to FIGS. 2 and 3, the display device of the present disclosure may be applied to various pixel structures such as 4T1C, 5T1C, 6T1C, 7T1C, etc. without being limited to the above-described structures.

Figure 4B:
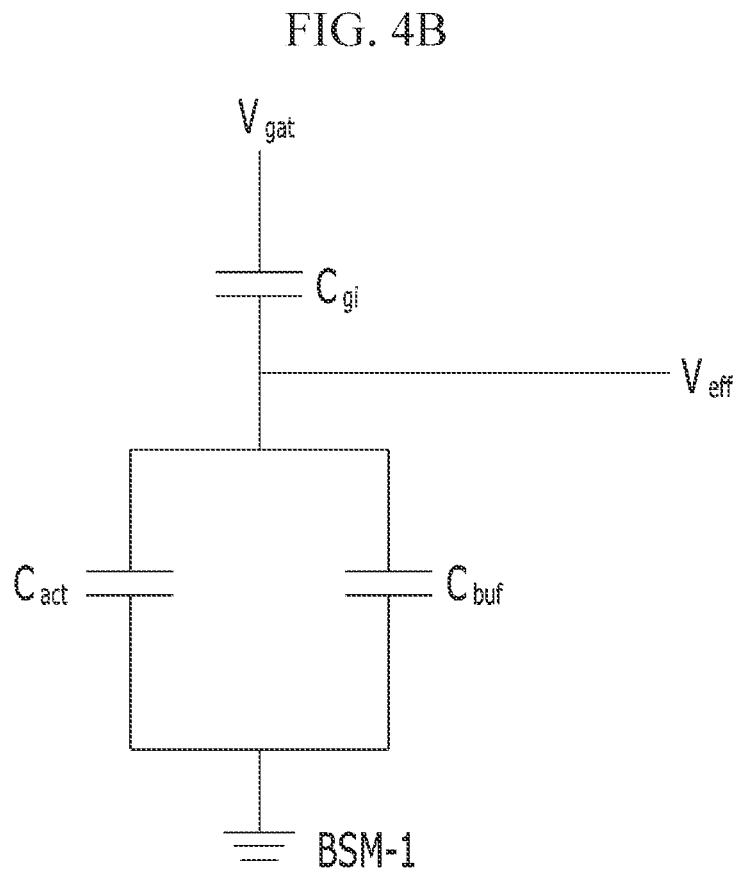

FIG. 4A is a cross-sectional view showing various thin film transistors and a storage capacitor in a display device according to an exemplary embodiment of the present disclosure. FIG. 4B is a circuit diagram showing a relation between parasitic capacitances generated within a driving thin film transistor according to an exemplary embodiment of the present disclosure.

As shown in FIG. 4A, a driving thin film transistor DT and a first switching thin film transistor ST-1 are disposed at a sub-pixel on a substrate 410. Although FIG. 4A illustrates only the driving thin film transistor DT and one switching thin film transistor ST-1, this illustration is only for convenience of description. Actually, a plurality of switching thin film transistors may be disposed on the substrate 410.

In addition, a plurality of thin film transistors GT for a gate driving circuit constituting a gate driver may be disposed in a non-display area NA, in particular, a gate-in-panel (GIP) area, on the substrate 410. Each thin film transistor GT for the gate driving circuit may use a polycrystalline semiconductor pattern as an active layer.

Although the thin film transistor GT for the gate driving circuit has been described in this embodiment as being disposed in the non-display area NA, a switching thin film transistor having the same structure as that of the thin film transistor GT for the gate driving circuit may be disposed at a sub-pixel in a display area.

Of course, the thin film transistor GT for the gate driving circuit disposed in the non-display area and the switching thin film transistor disposed in the display area have different kinds of dopants and, as such, may be configured to have different configurations as an N-type thin film transistor and a P-type thin film transistor.

Meanwhile, the plurality of thin film transistors disposed in the gate driver may constitute a CMOS configuration in which a thin film transistor for a gate driving circuit including a polycrystalline, semiconductor pattern and a switching thin film transistor including an oxide semiconductor pattern are paired.

The following description will be given in conjunction with an example in which a thin film transistor for a gate driving circuit using a polycrystalline semiconductor pattern as an active layer is disposed in the non-display area NA.

The thin film transistor GT for the gate driving circuit includes a polycrystalline semiconductor pattern 414 disposed on a lower buffer layer 411 formed on the substrate 410, a first gate insulating layer 443 configured to insulate the polycrystalline semiconductor pattern 414, a first gate electrode 416 disposed on the first gate insulating layer 443 while overlapping with the polycrystalline semiconductor pattern 414, a plurality of insulating layers formed on the first gate electrode 416, and a first source electrode 417S and a first drain electrode 417D disposed on the plurality of insulating layers.

The substrate 410 may be constituted by a multilayer structure which an organic layer and an inorganic layer are alternately stacked. For example, the substrate 410 may have a multilayer structure in which an organic layer of, for example, polyimide, and an inorganic layer of, for example, silicon oxide ($SiO_2$), are alternately stacked.

The lower buffer layer 411 is formed on the substrate 410. The lower buffer layer 411 functions to prevent moisture, etc. from penetrating from the outside. The lower buffer layer 411 may be formed by depositing an inorganic insulating layer such as a silicon oxide ($SiO_2$) layer in at least ogre layer.

The polycrystalline semiconductor pattern 414 is formed on the lower buffer layer 411, The polycrystalline semiconductor pattern 414 is used as the active layer of the thin film transistor. The polycrystalline semiconductor pattern 414 it eludes a first channel region 414*a*, and a first source region 414*b* and a first drain region 414*c* facing each other under the condition that the first channel region 414*a* is interposed therebetween.

The polycrystalline semiconductor pattern 414 is insulated by the first gate insulating layer 443. The first gate insulating layer 443 is formed by depositing an inorganic insulating layer of, for example, silicon oxide ($SiO_2$), in at least one layer on the entire surface of the substrate 410 formed with the polycrystalline semiconductor pattern 414. The first gate insulating layer 443 protects and insulates the polycrystalline semiconductor pattern 414 from the outside.

The first gate electrode 416 overlapping with the first channel region 414*a* of the polycrystalline semiconductor pattern 414 is formed on the first gate insulating layer 443.

The first gate electrode 416 array be made of a metal material. For example, the first gate electrode 416 may take the form of a single layer or multiple layers made of one of molybdenum (Mo), aluminum (Al), chromium (Cr), gold (Au), titanium (Ti), nickel (Ni), neodymium (Nd), and copper (Cu) or an alloy thereof, without being limited thereto.

A plurality of insulating layers may be formed among the first gate electrode 416, the first source electrode 417S, and the first drain electrode 417D.

Referring to FIG. 4A, the plurality of insulating layers may be an interlayer insulating layer 444 contacting an upper surface of the first gate electrode 416, and an upper buffer layer 445, a second gate insulating layer 446, and a third interlayer insulating layer 447 sequentially stacked on the interlayer insulating layer 444 in this order.

The first source electrode 417S and the first drain electrode 417D are disposed on the third interlayer insulating layer 447. The first source electrode 417S and the first drain electrode 417D are connected to the polycrystalline semiconductor pattern 414 through a first contact hole CH1 and a second contact hole CH2, respectively. The first contact hole CH1 and the second contact hole CH2 extend through the first gate insulating layer 443, the interlayer insulating layer 444, the upper buffer layer 445, the second gate insulating layer 446, and the third interlayer insulating layer 447, thereby exposing the first source region 414*b* and the first drain region 414*c* of the polycrystalline semiconductor pattern respectively.

Meanwhile, the driving thin film transistor DT, the first switching thin film transistor ST-1, and a storage capacitor Cst are disposed at the sub-pixel in a display area AA.

In an embodiment, each of the driving thin film transistor DT and the first switching thin film transistor ST-1 uses an oxide semiconductor pattern as an active layer.

The driving thin film transistor DT includes a first oxide semiconductor pattern 474, and a second gate electrode 478, a second source electrode 479S, and a second drain electrode 479D overlapping with the first oxide semiconductor pattern 474.

The oxide semiconductor of the first oxide semiconductor pattern 474 may be made of an oxide of a metal such as zinc (Zn), indium (In), gallium (Ga), tin (Sn), titanium (Ti), or the like, or a combination of a metal such as zinc (Zn), indium (In), gallium (Ga), tin (Sn), titanium (Ti), or the like and an oxide thereof. More specifically, the oxide semiconductor may include zinc oxide (ZnO), zinc-tin oxide (ZTO), zinc-indium oxide (ZIO), indium oxide (MO), titanium oxide (TiO), indium-gallium-zinc oxide (IGZO), indium-zinc-tin oxide (IZTO), or the like.

Generally, a polycrystalline semiconductor pattern advantageous in terms of high-speed operation is used as the active layer of the driving thin film transistor. In the case of a driving thin film transistor including a polycrystalline semiconductor pattern, there may be a problem in terms of power consumption in that leakage current is generated in an off state of the driving thin film transistor. In particular, the problem of generation of leakage current in an off state of the driving thin film transistor may be severe when the display device is driven at a low speed to display a still image such as a document screen. To this end, in an exemplary embodiment of the present disclosure, a driving thin film transistor using, as an active layer, an oxide semiconductor pattern advantageous in preventing generation of leakage current is proposed.

However, when the thin film transistor uses an oxide semiconductor pattern as an active layer, a current fluctuation value with respect to a voltage fluctuation value may be great due to characteristics of an oxide semiconductor material and, as such, failure may frequently occur in a low-grayscale range in which precise current control is required. Therefore, in accordance with an exemplary embodiment of the present disclosure, a driving thin film transistor in which fluctuation in current is relatively insensitive to fluctuation in a voltage applied to a gate electrode is proposed.

Referring to FIGS. 4A and 4B, the driving thin film transistor DT includes the first oxide semiconductor pattern 474, which is disposed on the upper buffer layer 445, the second gate insulating layer 446, which covers the first oxide semiconductor pattern 474, the second gate electrode 478, which is formed on the second gate insulating layer 446 while overlapping with the first oxide semiconductor pattern 474, and the second source electrode 479S and the second drain electrode 479D, which are disposed on the third interlayer insulating layer 447 covering the second gate electrode 478. The second gate electrode 478, the second source electrode 479S, and the second drain electrode 479D may be disposed on the same layer.

The first oxide semiconductor pattern 474, which is an active layer, includes a second channel region 474*a*, through which charges move, and a second source region 474*b* and a second drain region 474*c* disposed adjacent to the second channel region 474*a* under the condition that the second channel region 474*a* is interposed therebetween.

Meanwhile, a first light shielding pattern BSM-1 is formed under the first oxide semiconductor pattern 474. The first light shielding pattern BSM-1 prevents or at least reduces light incident from the outside from being irradiated onto the first oxide semiconductor pattern 474, thereby preventing or at least reducing the first oxide semiconductor pattern 474 sensitive to external light from malfunctioning.

In an embodiment of the present disclosure, the first light shielding pattern BSM-1 may be configured through inclusion of a semiconductor material layer.

Referring to FIGS. 4A and 4B, the first light shielding pattern BSM-1 may have a structure in which a first layer BSM-1*a* constituted by a conductive material layer such as a metal pattern, and a second layer BSM-1*b* constituted by a semiconductor material layer are stacked.

The semiconductor material layer may be various kinds of semiconductor material layers made of an amorphous semiconductor material, a polycrystalline semiconductor material, an oxide semiconductor material, etc.

The semiconductor material layer may be a P-type semiconductor material layer doped with P-type impurity ions such as boron ions.

The thin film transistor using an oxide semiconductor pattern as an active layer is an N-type thin film transistor. Accordingly, when P-type impurity ions are implemented into the semiconductor material layer, the Fermi level of the semiconductor material layer is lowered. In addition, the Fermi level of the first oxide semiconductor pattern 474 corresponding to the semiconductor material layer is also lowered in order to achieve balance of Fermi levels in a thermal equilibrium state. Accordingly, a threshold voltage Vth required to turn on the driving thin film transistor DT may be increased.

The driving thin film transistor DT including the first oxide semiconductor pattern 474 requires a very high threshold voltage in terms of design, as compared to other switching thin film transistors in the pixel. Typically, the switching thin film transistors require a threshold voltage approximate to 0 V, whereas the driving thin film transistor DT requires a threshold voltage of 1 V or more. Accordingly, the driving thin film transistor DT according to the embodiment of the present disclosure has an advantage in that an increase in threshold voltage may be achieved because a semiconductor material layer doped with P-type impurity ions is disposed under the first oxide semiconductor pattern 474.

In addition, the first, layer BSM-la of the first light shielding pattern BSM-1 may be a metal layer including a titanium (Ti) material capable of collecting hydrogen particles. For example, the metal layer may be a single titanium layer, a dual layer of molybdenum (Mo) and titanium (Ti), or an alloy layer of molybdenum (Mo) and titanium (Ti). However, the exemplary embodiment of the present disclosure is not limited to the above-described condition, and other metal layers including titanium (Ti) may also be used.

Titanium (Ti) may collect hydrogen particles diffused into the upper buffer layer 445, thereby preventing or at least reducing the hydrogen particles from reaching the first oxide semiconductor pattern 474.

When the first light shielding pattern BSM-1 is constituted by a plurality of layers, the first light shielding pattern BSM-1 may have a stack structure in which the semiconductor material layer is disposed at an uppermost side in one embodiment. This is because the semiconductor layer is required to be exposed upwards during execution of a process, in order to enable P-type impurity ions to be implemented in the semiconductor material layer.

In one embodiment, the first light shielding pattern BSM-1 may be formed vertically under the first oxide semiconductor pattern 474, to overlap with the first oxide semiconductor pattern 474. In addition, the first light shielding pattern BSM-1 may be formed to have a greater size than that of the first oxide semiconductor pattern 474, to completely overlap with the first oxide semiconductor pattern 474.

The second layer BSM-1*b* of the first light shielding pattern BSM-1, which is a semiconductor material layer, has a lower reflectivity than that of the first layer BSM-la of the first light shielding pattern BSM-1 which is a metal layer. Accordingly, it may be possible to reduce a phenomenon in which external light is incident into the first oxide semiconductor pattern 474 after being reflected by the first layer BSM-la of the first light shielding pattern BSM-1.

Meanwhile, the second source electrode 479S of the driving thin film transistor DT is electrically connected to the first light shielding pattern BSM-1. When the first light shielding pattern BSM-1 is electrically connected to the second source electrode 479S, the following additional effect may be obtained.

As the second source region 474*b* and the second drain region 474*c* of the first oxide semiconductor pattern 474 become conductive, a parasitic capacitance $C_{act}$ is generated in the first oxide semiconductor pattern 474 in an on/off operation. In addition, a parasitic capacitance $C_{gi}$ is generated between the second gate electrode 478 and the first oxide semiconductor pattern 474, in addition, a parasitic capacitance $C_{buf}$ is generated between the first light shielding pattern BSM-1 electrically connected to the second source electrode 479S and the first oxide semiconductor pattern 474.

Since the first oxide semiconductor pattern 474 and the first light shielding pattern BSM-1 are electrically interconnected by the second source electrode 479S, the parasitic capacitance $C_{act}$ and the parasitic capacitance $C_{buf}$ are connected in parallel, and the parasitic capacitance $C_{act}$ and the parasitic capacitance $C_{gi}$ are connected in series. In addition, when a gate voltage of $V_{gat}$ is applied to the second gate electrode 478, an effective voltage $V_{eff}$ actually applied to the first oxide semiconductor pattern 474 satisfies the following Expression 1.

$$\Delta V_{eff} = \frac{C_{gi}}{C_{gi} + C_{buf} + C_{act}} * \Delta V_{gat} \quad \text{[Expression 1]}$$

Thus, the effective voltage $V_{eff}$ applied to the second channel region 474*a* is inversely proportional to the parasitic capacitance $C_{buf}$ and, as such, it may be possible to adjust the effective voltage $V_{eff}$ applied to the first oxide semiconductor pattern 474 by adjusting the parasitic capacitance Gut.

That is, when the first light shielding pattern BSM-1 is disposed near the first oxide semiconductor pattern 474, to increase the parasitic capacitance $C_{buf}$, it may be possible to reduce an actual value of current flowing through the first oxide semiconductor pattern 474.

Reduction in the effective value of current flowing through the first oxide semiconductor pattern 474 means that an s-factor may be increased, and means that an actual control range of the driving thin film transistor DT controllable through the voltage $V_{gat}$ applied to the second gate electrode 478 may be widened.

That is, when the second source electrode 479S of the driving thin film transistor DT is electrically connected to the first light shielding pattern BSM-1, and the first light shielding pattern BSM-1 is disposed near the first oxide semiconductor pattern 474, it may be possible to accurately control the organic light emitting element even at low gray levels and, as such, to solve a problem of a Mura defect frequently generated at low gray levels.

Accordingly, in an embodiment of the present disclosure, the parasitic capacitance $C_{buf}$ generated between the first oxide semiconductor pattern 474 and the first light shielding pattern BSM-1 may be greater than the parasitic capacitance $C_{gi}$ generated between the second gate electrode 478 and the first oxide semiconductor pattern BSM-1.

Here, "s-factor" means a reciprocal value of a current variation to a gate voltage variation in an on/off transition period of a thin film transistor. That is, the s-factor may be a reciprocal value of a gradient of a curve in a characteristic graph of a drain current with respect to a gate voltage (V-I curve graph).

A small s-factor means a great gradient of a characteristic graph of a drain current with respect to a gate voltage. Accordingly, when a thin film transistor has a small s-factor, the thin film transistor may be turned on even by a low voltage and, as such, switching characteristics of the thin film transistor becomes better. However, sufficient grayscale expression is difficult because the thin film transistor reaches a threshold voltage within a short time.

A great s-factor means a small gradient of the characteristic graph of the drain current with respect to the gate voltage. Accordingly, when a thin film transistor has a great s-factor, the on off response time of the thin film transistor may be degraded and, as such, switching characteristics of the thin film transistor may be degraded. However, sufficient grayscale expression may be possible because the thin film transistor reaches a threshold voltage after a relatively lengthened time.

In particular, the first light shielding pattern BMS-1 may be disposed on the lower buffer layer 411, to overlap with the first oxide semiconductor pattern 474. In addition, the first gate insulating layer 443 completely covers the first light shielding pattern BSM-1. In addition, the interlayer insulating layer 444 and the upper buffer layer 445 are formed over the first gate insulating layer 443.

The upper buffer layer 445 may include first to third sub-upper buffer layers. The first sub-upper buffer layer and the third sub-upper buffer layer are constituted by silicon oxide ($SiO_2$) not including hydrogen particles, thereby preventing hydrogen particles from penetrating into the oxide semiconductor pattern during heat treatment. When hydrogen particles penetrate into the oxide semiconductor pattern, reliability of the thin film transistor is degraded.

On the other hand, the second sub-upper buffer layer may be constituted by silicon nitride ($SiN_x$) having an excellent hydrogen particle collection ability. The second sub-upper buffer layer may be formed only in a region where the first light shielding pattern BSM-1 is formed, or may be formed over the entire surface on the first sub-upper buffer layer.

Silicon nitride ($SiN_x$) is excellent in terms of hydrogen particle collection ability, as compared to silicon oxide ($SiO_2$). When hydrogen particles penetrate into an active layer constituted by an oxide semiconductor material, resultant thin film transistors may have a problem in that the thin film transistors have different threshold voltages or different conductivities at channels thereof. That is, reliability of the thin film transistors is degraded. In particular, in the case of a driving thin film transistor, securing reliability is important because the driving thin film transistor directly contributes to operation of the light emitting element associated therewith.

Accordingly, it may be possible to prevent or at least reduce degradation in reliability of the driving thin film transistor DT caused by hydrogen particles by partially or completely forming the second sub-upper buffer layer over the first sub-upper buffer layer.

When the second sub-upper buffer layer is partially deposited on the first sub-upper buffer layer, there is an advantage as follows.

That is, since the second sub-upper buffer layer is formed of a material different from that of the first sub-upper buffer layer, layer blister may occur between the heterogeneous material layers when the second sub-upper buffer layer is deposited over the entire surface of the display area. In order to solve such a problem, the second sub-upper buffer layer may be selectively formed only in a region where the first light shielding pattern BSM-1 is formed, for an enhancement in bonding force.

In one embodiment, the first light shielding pattern BSM-1 may be formed vertically under the first oxide semiconductor pattern 474, to overlap with the first oxide semiconductor pattern 474. In addition, the first light shielding pattern BSM-1 may be formed to have a size greater than that of the first oxide semiconductor pattern 474, to completely overlap with the first oxide semiconductor pattern 474.

Meanwhile in an embodiment of the present disclosure, the first light shielding pattern BSM-1 may include a semiconductor material layer doped with P-type ions, thereby increasing the threshold voltage of the driving thin film transistor DT. In addition, the first light shielding pattern BSM-1 may be disposed near the first oxide semiconductor pattern 474, thereby increasing the parasitic capacitance generated between the first oxide semiconductor pattern 474 and the first light shielding pattern BSM-1. In this case, the s-factor of the driving thin film transistor DT is increased and, as such, it may be possible to achieve grayscale expression at low gray levels.

Meanwhile, the second gate electrode 478 of the driving thin film transistor DT is insulated by the third interlayer insulating layer 447. The second source electrode 479S and the second drain electrode 479D are formed on the third interlayer insulating layer 447.

Although the second source electrode 479S and the second drain electrode 479D are shown as being disposed on the same layer, and the second gate electrode 478 is shown as being formed on a layer different from that of the second source electrode 479S and the second drain electrode 479D in the embodiment of the present disclosure referring to FIG. 4A, all of the second gate electrode 478, the second source electrode 479S, and the second drain electrode 479D may be disposed on the same layer.

The second source electrode 479S and the second drain electrode 4791) are connected to the second source region 474*b* and the second drain region 474*c* via a third contact hole CH3 and a fourth contact hole CH4, respectively. In addition, the first light shielding pattern BSM-1 is connected to the second source electrode 479S via a fifth contact hole CH5.

Meanwhile, the first switching thin film transistor ST-1 includes a second oxide semiconductor pattern 432, a third gate electrode 433, a third source electrode 434S, and a third drain electrode 434D.

The second oxide semiconductor pattern 432 includes a third channel region 432*a*, and a third source region 432*b* and a third drain region 432*c* disposed adjacent to the third channel region 432*a* under the condition that the third channel region 432*a* is interposed therebetween.

The third gate electrode 433 is disposed over the second oxide semiconductor pattern 432 under the condition that the second gate insulating layer 446 is interposed therebetween.

The third source electrode 434S and the third drain electrode 434D may be disposed on the same layer as the second source electrode 479S and the second drain electrode 479D. That is, the second source/drain electrodes 479S and 479D and the third source/drain electrodes 434S and 434*f*) may be disposed on the third interlayer insulating layer 447.

Of course, the third source/drain electrodes 434S and 434D may be disposed on the same layer as the third gate electrode 433. That is, the third source/drain electrodes 434S and 434D may be formed on the second gate insulating layer 446 simultaneously with the third gate electrode 433, using the same material as that of the third gate electrode 433.

In addition, a second light shielding pattern BSM-2 may be disposed under the second oxide semiconductor pattern 432.

The second light shielding pattern BSM-2 may have the same configuration as that of the first light shielding pattern BSM-1. That is, the second light shielding pattern BSM-2 may have a structure in which a first layer BSM-2*a* constituted by a metal material layer, and a second layer BSM-2*b* constituted by a semiconductor material are stacked. Of course, the second light shielding pattern BSM-2 may have a single-layer structure constituted by a semiconductor material layer doped with impurities.

P-type impurity ions are implemented in the second layer BSM-2*b* of the second light shielding pattern BSM-2.

The second light shielding pattern BSM-2 is disposed under the second oxide semiconductor pattern 432 while overlapping with the second oxide semiconductor pattern 432 in order to protect the second oxide semiconductor pattern 432 from light incident from the outside.

The second light shielding pattern BSM-2 may be formed over the lower buffer layer 411 together with the first light shielding pattern BSM-1.

The third gate electrode 433 and the second light shielding pattern BSM-2 may be electrically interconnected, thereby constituting a dual gate.

Since the second light shielding pattern BSM-2 includes a semiconductor material layer doped with P-type impurity ions, the second light shielding pattern BSM-2 may increase the threshold voltage of the first switching thin film transistor ST-1 including the oxide semiconductor pattern. In other words, as the third gate electrode 433 is conductive in accordance with implementation of P-type impurity ions therein, the Fermi level thereof is lowered. In addition, the Fermi level of the second oxide semiconductor pattern 432 corresponding to the third gate electrode 433 is also lowered. Accordingly, the threshold voltage of the first switching thin film transistor ST-1 is increased. In particular, referring to FIGS. 2 and 3, when the first switching thin film transistor ST-1 is a sampling transistor connected to a gate node of the driving thin film transistor DT, a great effect may be exhibited. The sampling transistor functions to provide a data voltage to one electrode of the storage capacitor during a sampling period.

The sampling transistor is known as a very sensitive transistor in which a channel thereof is opened even at a low voltage. In the embodiment of the present disclosure, since the second light shielding pattern BSM-2, which includes the semiconductor material layer doped with P-type impurity ions, is disposed under the second oxide semiconductor pattern 432, it may be possible to increase the threshold voltage of the first switching thin film transistor ST-1 and, as such, there is an advantage in that freedom of an internal compensation circuit configuration may be enhanced.

Meanwhile, when each of the first light shielding pattern BSM-1 and the second light shielding pattern BSM-2 is constituted by a plurality of layers including a metal material layer and a semiconductor material layer, the semiconductor material layer may be disposed over the metal material layer in one embodiment. This is because, for implementation of impurities in the semiconductor material layer, the semiconductor material layer should be deposited over the metal material layer such that the semiconductor material layer is exposed upwards.

Meanwhile, referring to FIG. 4A, the sub-pixel includes a storage capacitor Cst.

The storage capacitor Cst stores a data voltage applied thereto via a data line for a predetermined period, and then provides the stored data voltage to the organic light emitting element.

The storage capacitor Cst includes two electrodes corresponding to each other, and a dielectric disposed between the two electrodes. The storage capacitor Cst includes a first electrode 450A disposed on the same layer as the first gate electrode 416 and made of the same material as that of the first gate electrode 416, and a second electrode 450B facing the first electrode 450A while overlapping with the first electrode 450A.

The interlayer insulating layer 444 may be interposed between the first electrode 450A and the second electrode 450B of the storage capacitor Cst.

The second electrode 450B of the storage capacitor Cst may be electrically connected to the second source electrode 479S via an eighth contact hole CH8.

In addition, there may be an advantage in that mask processes are reduced because the first electrode 450A of the storage capacitor Cst is formed on the same layer as the first gate electrode 416.

Meanwhile, referring to FIG. 4A, a first planarization layer PLN1 may be formed over the substrate 410 on which the driving thin film transistor DT and the first switching thin film transistor ST-1 are disposed. Although the first planarization layer PLN1 may be formed of an organic material such as photoacryl, the first planarization layer PLN1 may also be constituted by a plurality of layers constituted h an inorganic layer and an organic layer. A connection electrode 455 electrically interconnects the anode 456, which is one constituent element of a light emitting device part 460, and the driving thin film transistor DT via a ninth contact hole CH9 formed in the first planarization layer PLN1.

In addition, a conductive layer used to form the connection electrode 455 may constitute a part of various link lines disposed in a bending area BA.

A second planarization layer PLN2 may be formed over the connection electrode 455. Although the second planarization layer PLN2 may be formed of an organic material such as photoacryl, the second planarization layer PLN2 may also be constituted by a plurality of layers constituted by an inorganic layer and an organic layer.

The anode 456 is formed on the second planarization layer PLN2. The anode 456 is electrically connected to the connection electrode 455 via a tenth contact hole CH10 formed in the second planarization layer PLN2.

The anode 456 may take the form of a single layer or multiple layers made of a metal such as calcium (Ca), barium (Ba), magnesium (Mg), aluminum (Al), silver (Ag), etc. or an alloy thereof. The anode 456 is connected to the second drain electrode 479D of the driving thin film transistor DT and, as such, an image signal from the outside is applied thereto.

In addition to the anode 456, an anode connection electrode 457, which electrically interconnect a common voltage line VSS and a cathode 463, may be further provided in a non-display area NA.

A bank layer 461 is formed over the second planarization layer PLN2. The hank layer 461 is a kind of harrier, and may partition sub-pixels, thereby preventing light of particular colors output from adjacent ones of the sub-pixels from being output in a mixed state.

An organic light emitting layer 462 is formed on a surface of the anode 456 and a portion of an inclined surface of the bank layer 461. The organic light emitting layer 462 may be an R-organic light emitting layer configured to emit red light, a Ci-organic light emitting layer configured to emit green light, or a B-organic light emitting layer configured to emit blue light, which is formed at each sub-pixel. In addition, the organic light emitting layer 462 may be a W-organic light emitting layer configured to emit white light.

The organic light emitting layer 462 may include not only a light emitting layer, but also an electron injection layer and a hole injection layer respectively configured to inject electrons and holes into the light emitting layer, an electron transportation layer and a hole transportation layer respectively configured to transport electrons and holes to an organic layer, etc.

The cathode 463 is formed over the organic light emitting layer 462. The cathode 463 may be made of a transparent conductive material such as indium tin oxide (ITO) or indium zinc oxide (1120), or a thin metal allowing transmission of visible light therethrough, without being limited thereto.

An encapsulation layer part 470 is forted over the cathode 463. The encapsulation layer part 470 may be constituted by a single layer formed of an inorganic layer, a double layer of inorganic layer/organic layer, or a triple layer of inorganic layer/organic layer/inorganic layer. The inorganic layer may be constituted by an inorganic material such as $SiN_x$, SiX, or the like, without being limited thereto. In addition, the organic layer may be constituted by an organic material such as polyethylene terephthalate, polyethylene naphthalate, polycarbonate, polyimide, polyethylene sulfonate, polyoxymethylene, polyarylate, etc., or a mixture thereof, without being limited thereto.

In FIG. 4A, an embodiment of the e capsulation layer part 4 is illustrated as being constituted by a triple layer of inorganic layer 471/organic layer 472/inorganic layer 473.

A touch layer and a cover glass may be disposed over the encapsulation layer part 470, and may be attached to the encapsulation layer part 470 by an adhesive layer. Although any material may be used as the adhesive layer, so long as the material exhibits excellent attachment force while being excellent in terms of heat resistance and water resistance, a thermosetting resin such as an epoxy-based compound, an acrylate-based compound, or acryl-based rubber may be used in the present disclosure. In this case, the adhesive layer is cured through irradiation of the adhesive layer with light such as ultraviolet light.

The adhesive layer may not only serve to assemble the substrate 410 and the cover glass, but also to function as an encapsulator for preventing penetration of moisture into an interior of the display device which may be an organic electroluminescent display device.

The cover glass may be an encapsulation cap for encapsulating the organic electroluminescent display device, and may use a protective film such as a polystyrene (PS) film, a polyethylene (PE) film, a polyethylene naphthalate (PEN) film, a polyimide (PI) film, or the like, and may use glass.

Hereinafter, various embodiments of the present disclosure will be described with reference to FIGS. 5 to 13. In the embodiments, configurations of thin film transistors disposed in a display area AA will be described.

Figure 5:
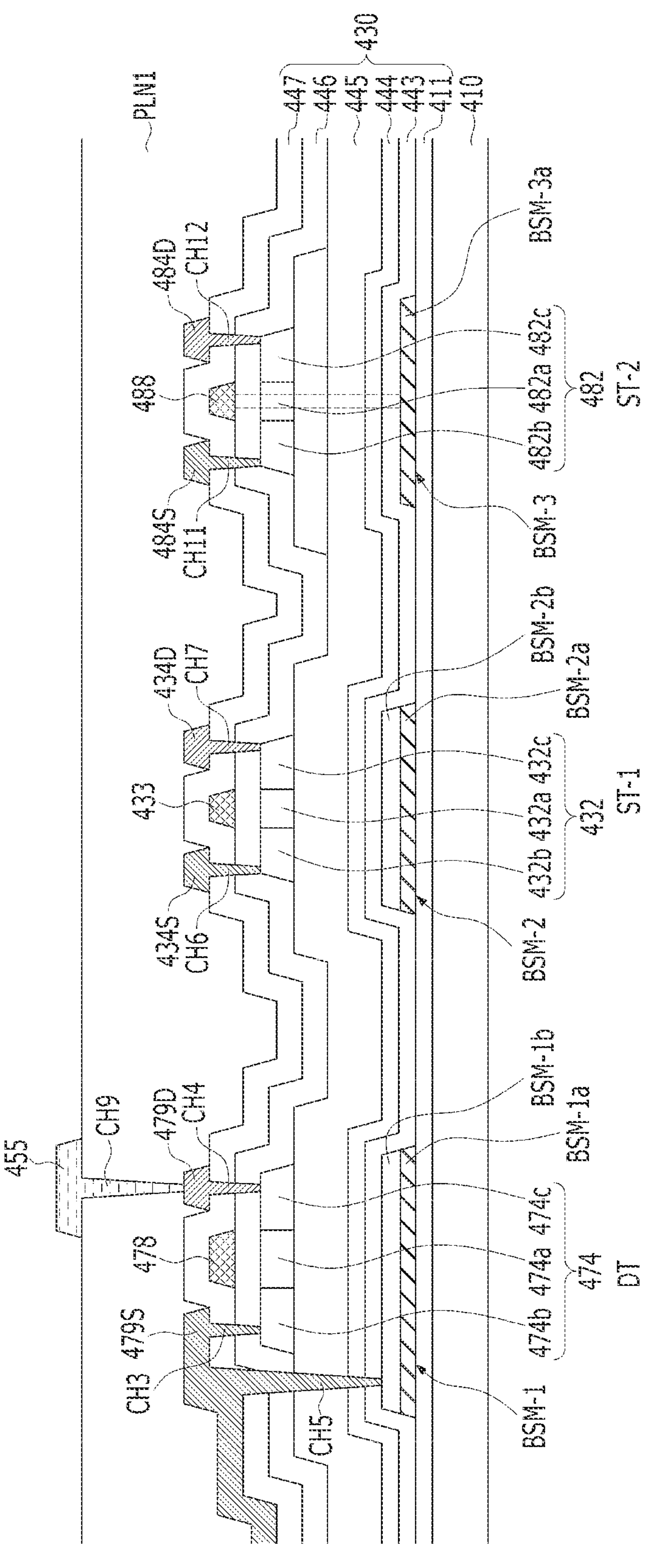
FIG. 5 is a cross-sectional view showing one driving thin film transistor and two switching thin film transistors in a display device according to another exemplary embodiment of the present disclosure.

Referring to FIG. 5, a display device according to another exemplary embodiment of the present disclosure discloses one driving thin film transistor DT and two switching thin film transistors ST-1 and ST-2.

The driving thin film transistor DT and the first switching thin film transistor ST-1 may have configurations identical to those of the embodiment referring to FIG. 4A.

In this embodiment, the first switching thin film transistor ST-1 and the second switching thin film transistor ST-2 include a second light shielding pattern BSM-2 and a third light shielding pattern BSM-3, respectively. The second light shielding pattern BSM-2 and the third light shielding pattern BSM-3 may be disposed on the same insulating layer. In addition, as in the first switching thin film transistor ST-1 in the previous embodiment, the second light shielding pattern BSM-2 may have a structure in which a first layer BSM-2*a* constituted by a metal material layer, and a second layer BSM-2*b* constituted by a semiconductor material layer doped with P-type positive impurity ions are stacked. On the other hand, the third light shielding pattern BSM-3 may be constituted only by a metal material layer.

The first switching thin film transistor ST-1 may be a sampling transistor constituting an internal compensation circuit, and the second switching thin film transistor ST-2 may be a switching thin film transistor other than the sampling transistor. For example, the second switching thin film transistor ST-2 may be an initialization transistor.

The driving thin film transistor DT and the first switching thin film transistor ST-1 may have the same configurations as those of the embodiment of FIG. 4A and, as such, no detailed description thereof will be given.

The second switching thin film transistor ST-2 may also have the same configuration as that of the first switching thin film transistor ST-1, except for the third light shielding pattern BSM-3.

That is, the second switching thin film transistor ST-2 includes a third oxide semiconductor pattern 482 disposed on an upper buffer layer 445, a fourth gate electrode 488 disposed to overlap with the third oxide semiconductor pattern 482, and a fourth source electrode 484S and a fourth drain electrode 484D electrically connected to the third oxide semiconductor pattern 482. In addition, the second switching thin film transistor ST-2 includes the third light shielding pattern BSM-3 disposed under the third oxide semiconductor pattern 482.

The third oxide semiconductor pattern 482 includes a fourth channel region 482*a*, and conductive regions, that is, a fourth source region 482*b* and a fourth drain region 482*c*.

The fourth source electrode 484S and the fourth drain electrode 484D are connected to the fourth source region 482*b* and the fourth drain region 482*c* via an eleventh contact hole CH11 and a twelfth contact hole CH12, respectively.

All of second source/drain electrodes 479S and 479D, third source/drain electrodes 434S and 434D, and the fourth source/drain electrodes 484S and 484D may be disposed on the same layer, and may be simultaneously formed through one mask process, using the same material.

All of a second gate electrode 478, a third gate electrode 433, and the fourth gate electrode 488 may be formed on the same insulating layer, using the same material. In this case, formation of the gate electrodes may be achieved through one mask process.

The third light shielding pattern BSM-3 may be a light shielding pattern constituted only by a metal pattern, differently from the second light shielding pattern BSM-2.

That is, the first switching thin film transistor ST-1 exhibits an increase in threshold voltage because the first switching thin film transistor ST-1 includes the second light shielding pattern BSM-2 including the semiconductor material layer, whereas the second switching thin film transistor ST-2 does not exhibit a variation in threshold voltage caused by the third light shielding pattern BSM-3 because the third light shielding pattern BSM-3 is constituted only by a metal material layer.

Accordingly, among the switching thin film transistors constituting the internal compensation circuit of the pixel, the thin film transistor requiring an increase in threshold voltage may include a light shielding pattern including a semiconductor material layer, as in the first switching thin film transistor ST-1, and the thin film transistor not requiring a variation in threshold voltage may include a light shielding pattern constituted only by a metal pattern, as in the second switching thin film transistor ST-2.

For example, the first switching thin film transistor ST-1 may be a sampling transistor, and the second switching thin film transistor ST-2 may be an initialization transistor.

The second light shielding pattern BSM-2 and the third light shielding pattern BSM-3 may be simultaneously formed on a lower buffer layer 411.

Since the second light shielding pattern BSM-2 includes the first layer BSM-2*a* and the second layer BSM-2*b* constituted by the semiconductor material layer, the mask process may be a process using a halftone mask. The halftone mask process may be performed using a known method and, as such, no detailed description thereof will be given.

Figure 6:
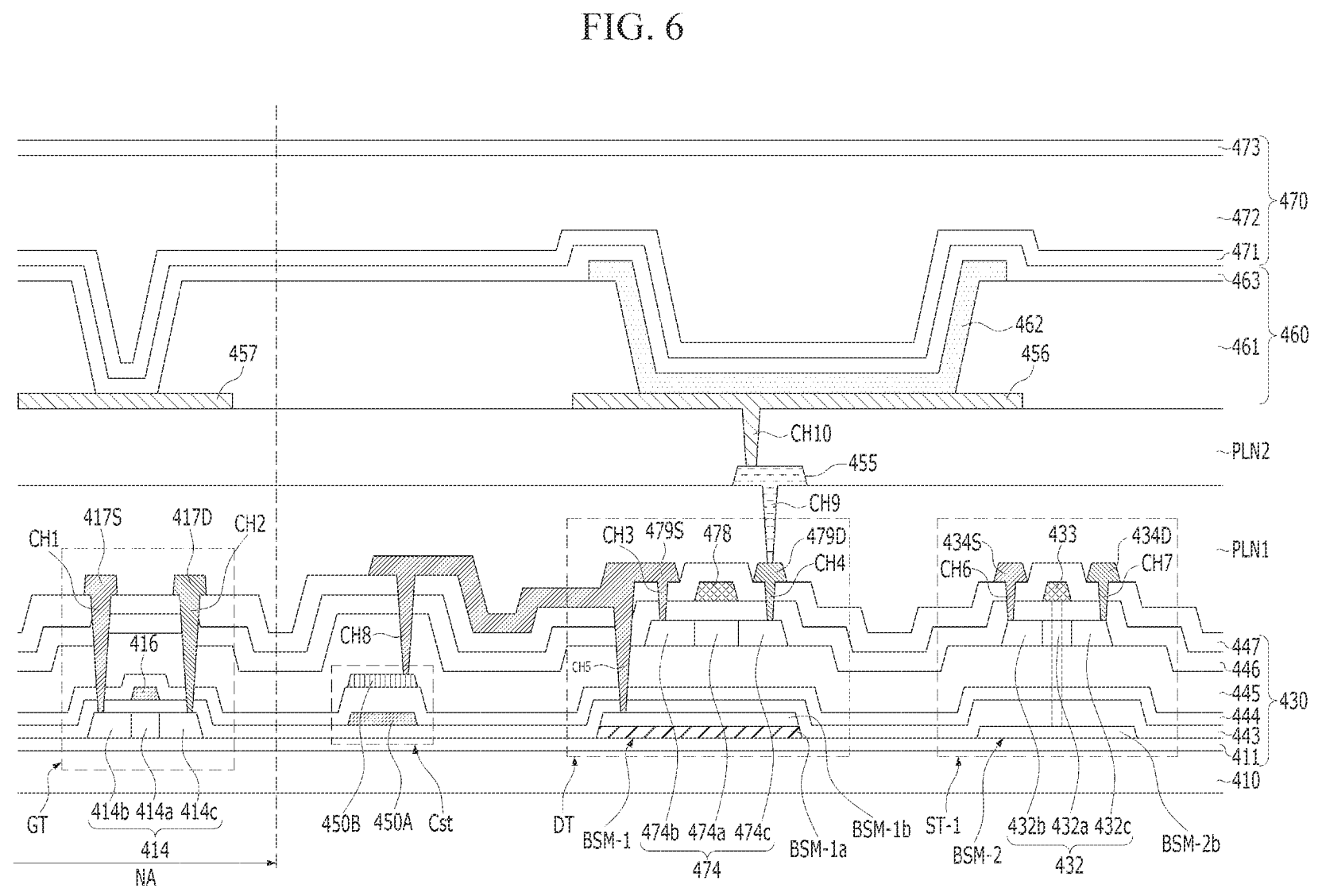

FIG. 6 is a view showing a display device according to another exemplary embodiment of the present disclosure.

Referring to FIG. 6, configurations of a gate-driving thin film transistor GT and a storage capacitor Cst may be identical to those of the embodiment referring to FIG. 4A. Accordingly, no detailed description of the gate-driving thin film transistor GT and the storage capacitor Cst will be given.

A first switching thin film transistor ST-1 includes a second light shielding pattern BSM-2 disposed on a lower buffer layer 411, a second oxide semiconductor pattern 432 disposed over the second light shielding pattern BSM-2 while overlapping with the second light shielding pattern BSM-2, a third gate electrode 433 disposed over the second oxide semiconductor pattern 432 while overlapping with the second oxide semiconductor pattern 432, and a third source electrode 434S and a third drain electrode 434D electrically connected to the second oxide semiconductor pattern 432.

An upper buffer layer 445 is disposed between the second oxide semiconductor pattern 432 and the second light shielding pattern BSM-2.

The upper buffer layer 445 is deposited on an upper surface of an interlayer insulating layer 444 and, as such, the interlayer insulating layer 444 may function as a first sub-upper buffer layer. Accordingly, the upper buffer layer 445 may be constituted only by a second sub-upper buffer layer and a third sub-upper buffer layer. However, the configuration of the upper buffer layer 445 is not limited to the configuration illustrated in FIG. 6.

In addition, the second light shielding pattern BSM-2 may be disposed on the same layer as a first light shielding pattern BSM-1 and, as such, mask processes may be reduced.

In this case, the second light shielding pattern BSM-2 may have a structure constituted by a single layer BSM-2*b* formed of a semiconductor material layer doped with impurity ions. The second light shielding pattern BSM-2 constituted by a single layer is doped with P-type impurity ions. Since the second light shielding pattern BSM-2 is disposed under the second oxide semiconductor pattern 432, it may be possible to increase the threshold voltage of the first switching thin film transistor ST-1 and, as such, there is an advantage in that freedom of an inner compensation circuit configuration may be enhanced.

In this embodiment, the second light shielding pattern BSM-2 may be electrically connected to the third gate electrode 433, thereby constituting a dual gate.

Meanwhile, a driving thin film transistor DT includes the first light shielding pattern BSM-1 disposed on the lower buffer layer 411. The driving thin film transistor DT may have a configuration identical to the configuration disclosed in the embodiment of FIG. 4A.

Briefly, in this embodiment, a configuration in which the first light shielding pattern BSM-1 and the second light shielding pattern BSM-2 are disposed on the same layer, thereby achieving a reduction in the number of manufacturing processes and an increase in the threshold voltage of the first switching thin film transistor ST-1.

Figure 7:
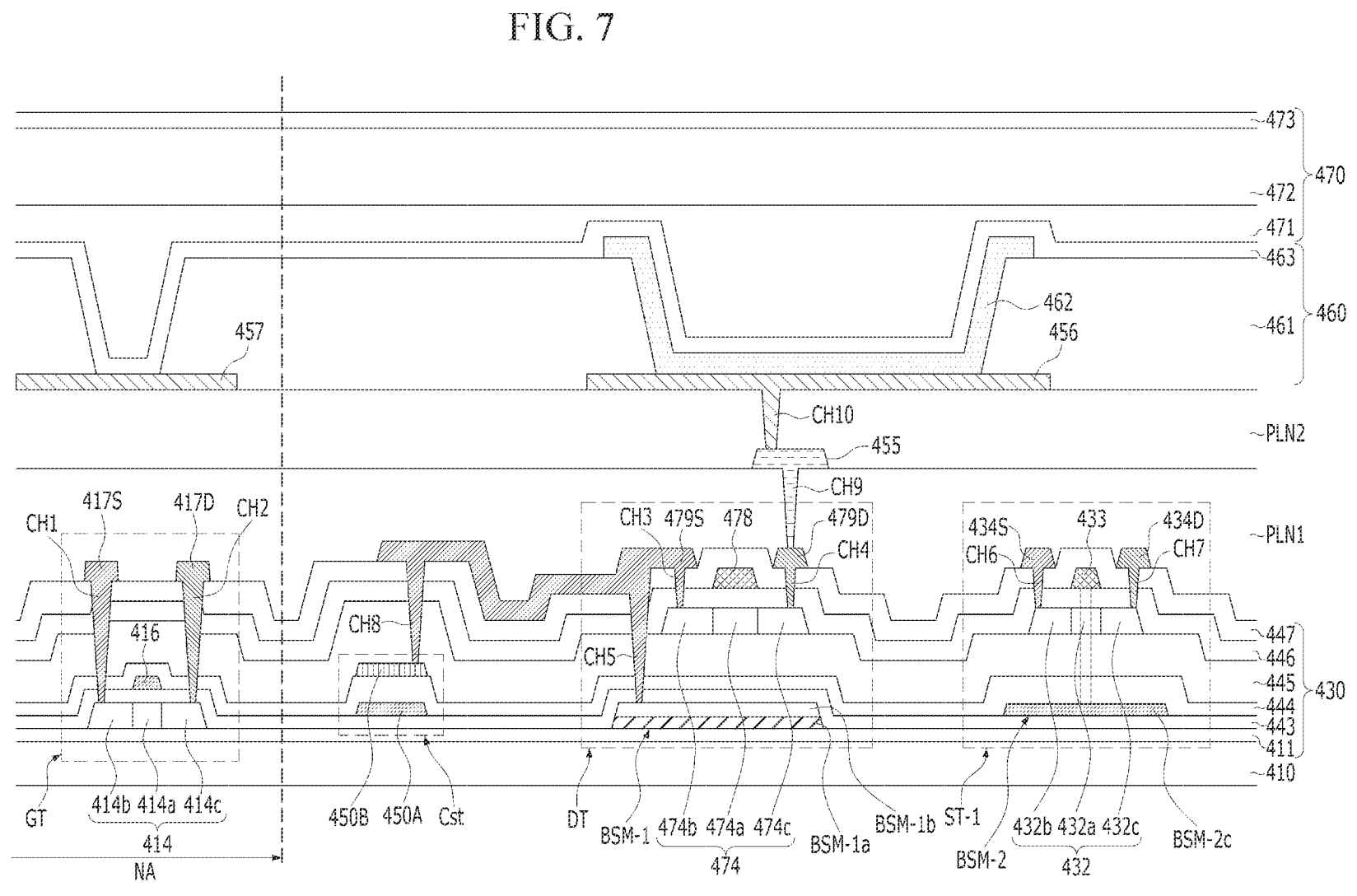

FIG. 7 is a view showing a display device according to another exemplary embodiment of the present disclosure.

Referring to FIG. 7, configurations of a gate-driving thin film transistor GT and a storage capacitor Cst may be identical to those of the embodiment referring to FIG. 4A. Accordingly, no detailed description of the gate-driving thin film transistor GT and the storage capacitor Cst will be given.

In this case, a first light shielding pattern BSM-1 may have a structure constituted by a single layer BSM-1*b* formed of a semiconductor material layer doped with impurity ions. The first light shielding pattern BSM-1 constituted by a single layer is doped with P-type impurity ions. Since the first light shielding pattern BSM-1 is disposed under a first oxide semiconductor pattern 474, it may be possible to increase a threshold voltage of a driving thin film transistor DT and, as such, there is an advantage in that freedom of an inner compensation circuit configuration may be enhanced.

Meanwhile, a first switching thin film transistor ST-1 includes a second light shielding pattern BSM-2 disposed on a lower buffer layer 411. The first switching thin film transistor ST-1 may have a configuration identical to the configuration disclosed in the embodiment of FIG. 4A.

Figure 8:
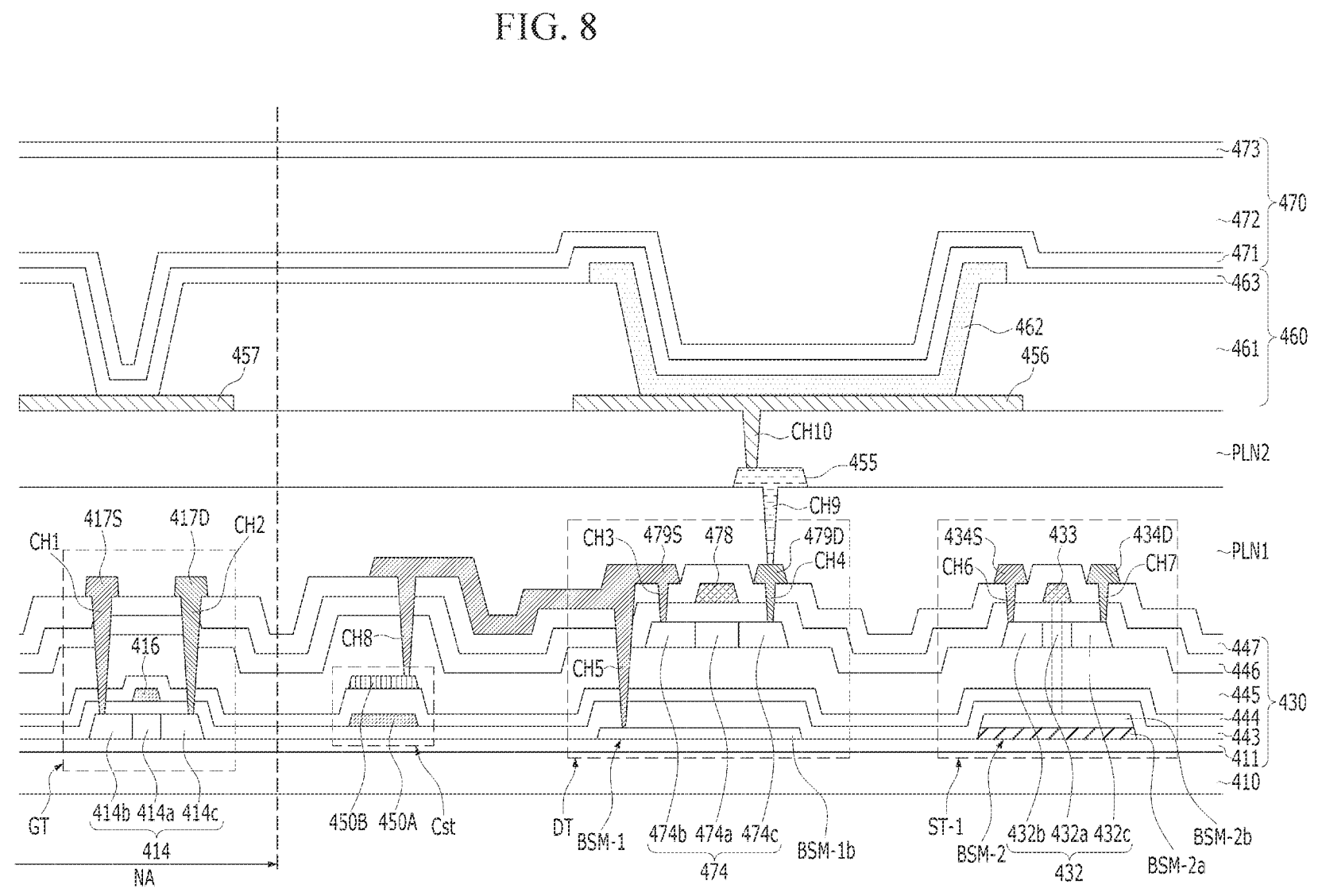

FIG. 8 is a view showing a display device according to another exemplary embodiment of the present disclosure.

Referring to FIG. 8, configurations of a gate-driving thin film transistor GT and a storage capacitor Cst may be identical to those of the embodiment referring to FIG. 4A. Accordingly, no detailed description of the gate-driving thin film transistor GT and the storage capacitor Cst will be given.

In this case, a first light shielding pattern BSM-1 may have a structure constituted by a single layer BSM-1*b* formed of a semiconductor material layer doped with impurity ions. The first light shielding pattern BSM-1 constituted by a single layer is doped with P-type impurity ions. Since the first light shielding pattern BSM-1 is disposed under a first oxide semiconductor pattern 474, it may be possible to increase a threshold voltage of a driving thin film transistor DT and, as such, there is an advantage in that freedom of an inner compensation circuit configuration may be enhanced.

In addition, a second light shielding pattern BSM-2 may have a structure constituted by a single layer BSM-2*b* formed of a semiconductor material layer doped with impurity ions. The second light shielding pattern BSM-2 constituted by a single layer is doped with P-type impurity ions. Since the second light shielding pattern BSM-2 is disposed under a second oxide semiconductor pattern 432, it may be possible to increase a threshold voltage of a first switching thin film transistor ST-1 and, as such, there is an advantage in that freedom of an inner compensation circuit configuration may be enhanced.

Figure 9:
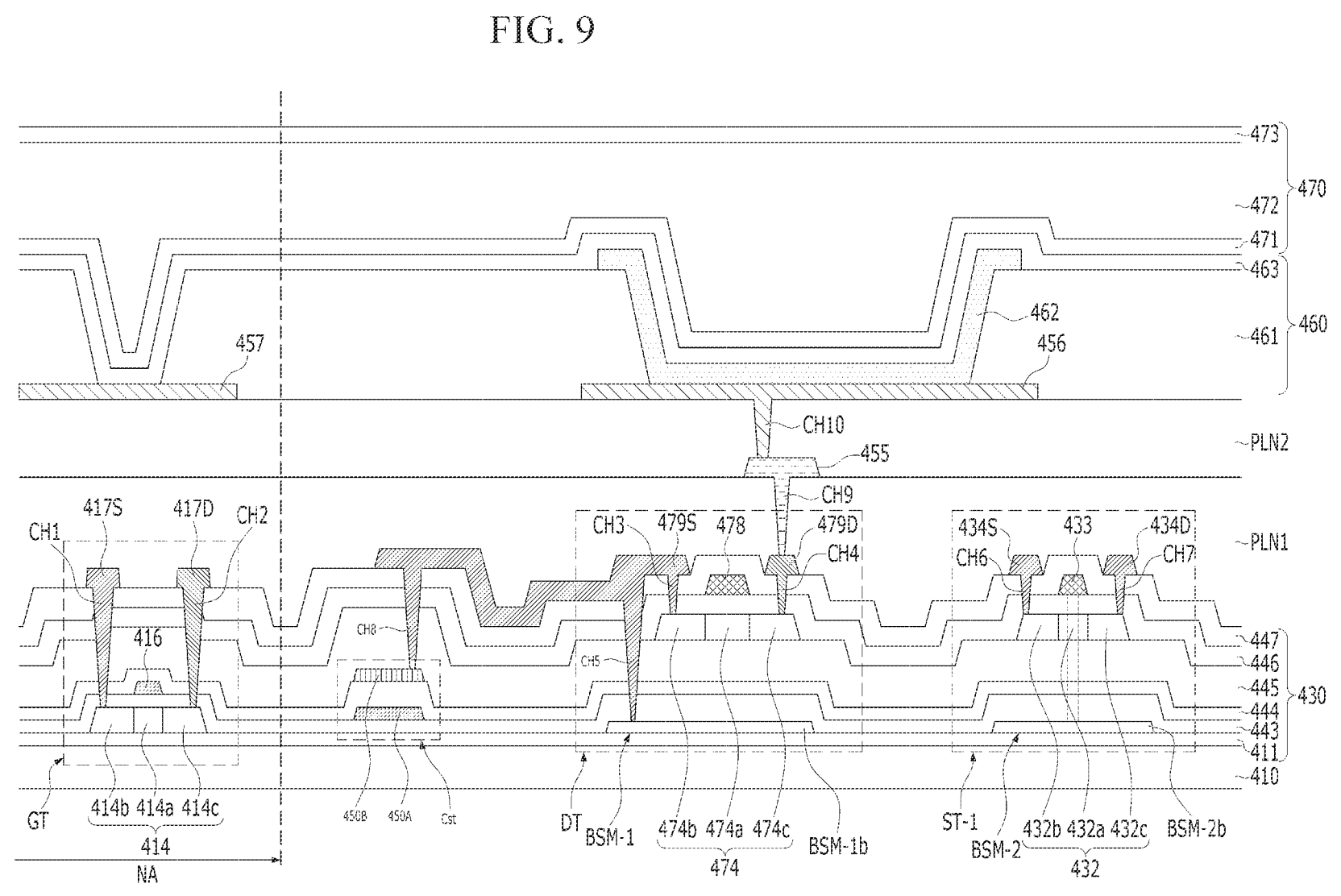

FIG. 9 is a view showing a display device according to another exemplary embodiment of the present disclosure.

Referring to FIG. 9, configurations of a gate-driving thin film transistor GT and a storage capacitor Cst may be identical to those of the embodiment referring to FIG. 4A. Accordingly, no detailed description of the gate-driving thin film transistor GT and the storage capacitor Cst will be given.

A second light shielding pattern BSM-2 may be disposed on a first gate insulating layer 443, together with a first gate electrode 416 of the gate-driving thin film transistor GT and a first electrode 450A of the storage capacitor Cst. Accordingly, the second light shielding pattern BSM-2, the first gate electrode 416 of the gate-driving thin film transistor GT, and the first electrode 450A of the storage capacitor Cst may be simultaneously formed using a single mask.

In this case, the second light shielding pattern BSM-2 may be a light shielding pattern constituted only by a metal pattern. That is, a first switching thin film transistor ST-1, which includes the second light shielding pattern BSM-2, does not exhibit a variation in threshold voltage caused by the second light shielding pattern BSM-2 because the second light shielding pattern BSM-2 is constituted only by a metal material layer.

Accordingly, among switching thin film transistors constituting an inner compensation circuit of a pixel, a thin film transistor not requiring a variation in threshold voltage may include a light shielding pattern constituted only by a metal pattern.

Meanwhile, a driving thin film transistor DT includes a first light shielding pattern BSM-1 disposed on a lower buffer layer 411. The driving thin film transistor DT may have a configuration identical to the configuration disclosed in the embodiment of FIG. 4A.

Figure 10:
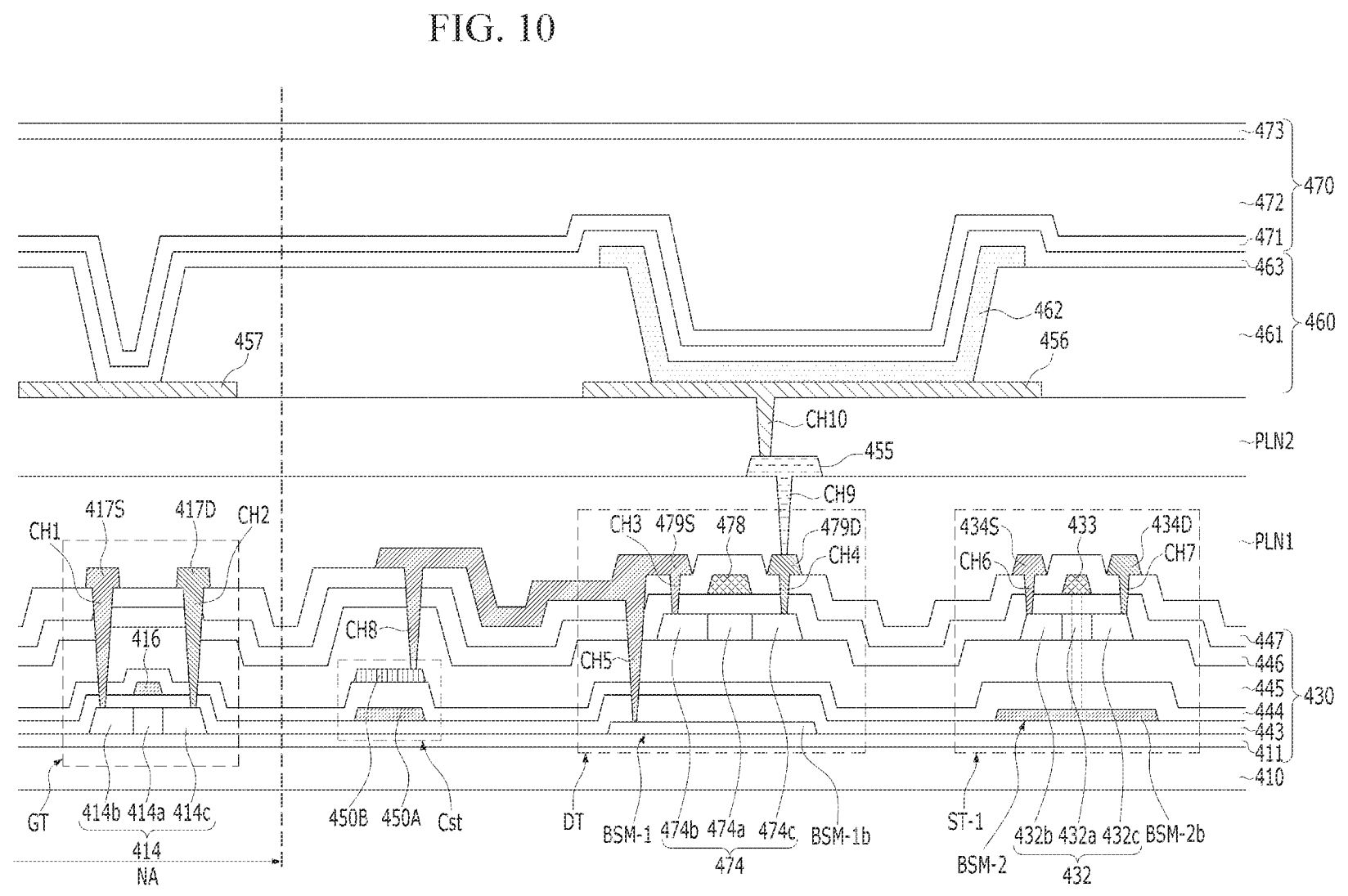

FIG. 10 is a view showing a display device according to another exemplary embodiment of the present disclosure.

Referring to FIG. 10, configurations of a gate-driving thin film transistor GT and a storage capacitor Cst may be identical to those of the embodiment referring to FIG. 4A. Accordingly, no detailed description of the gate-driving thin film transistor GT and the storage capacitor Cst will be given.

A second light shielding pattern BSM-2 may be a light shielding pattern constituted only by a metal pattern, and may be disposed on a first gate insulating layer 443, together with a first gate electrode 416 of the gate-driving thin film transistor GT and a first electrode 450A of the storage capacitor Cst.

In addition, a first light shielding pattern BSM-1 may have a structure constituted by a single layer BSM-1*b* formed of a semiconductor material layer doped with impurity ions.

Figure 11:
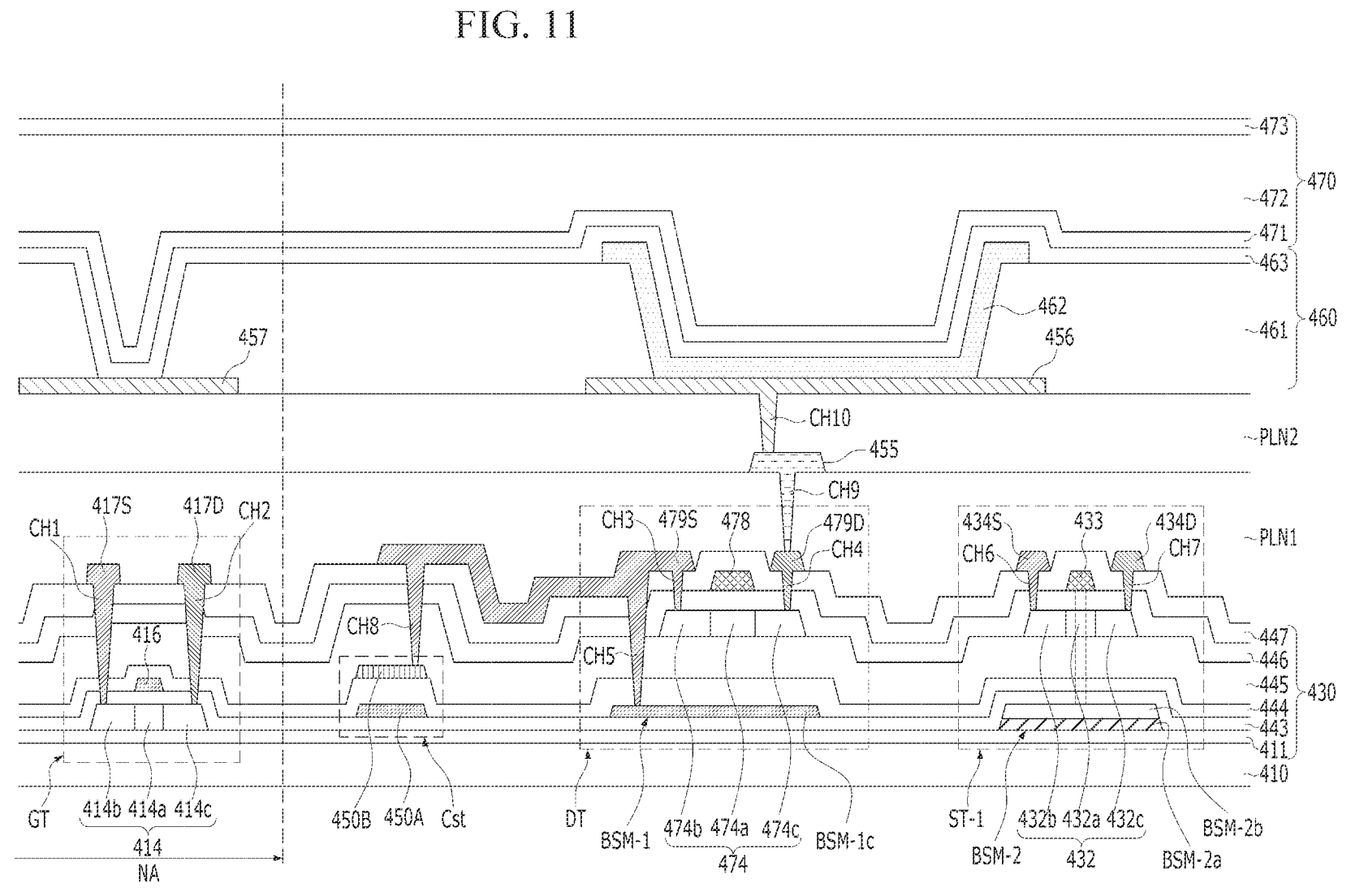

FIG. 11 is a view showing a display device according to another exemplary embodiment of the present disclosure.

Referring to FIG. 11, configurations of a gate-driving thin film transistor GT and a storage capacitor Cst may be identical to those of the embodiment referring to FIG. 4A. Accordingly, no detailed description of the gate-driving thin film transistor GT and the storage capacitor Cst will be given.

A first light shielding pattern BSM-1 may be disposed on a first gate insulating layer 443, together with a first gate electrode 416 of the gate-driving thin film transistor GT and a first electrode 450A of the storage capacitor Cst. Accordingly, the first light shielding pattern BSM-1, the first gate electrode 416 of the gate-driving thin film transistor GT, and the first electrode 450A of the storage capacitor Cst may be simultaneously formed using a single mask.

Meanwhile, a first switching thin film transistor ST-1 includes a second light shielding pattern BSM-2 disposed on a lower buffer layer 411, and may have a configuration identical to the configuration disclosed in the embodiment of FIG. 4A.

Figure 12:
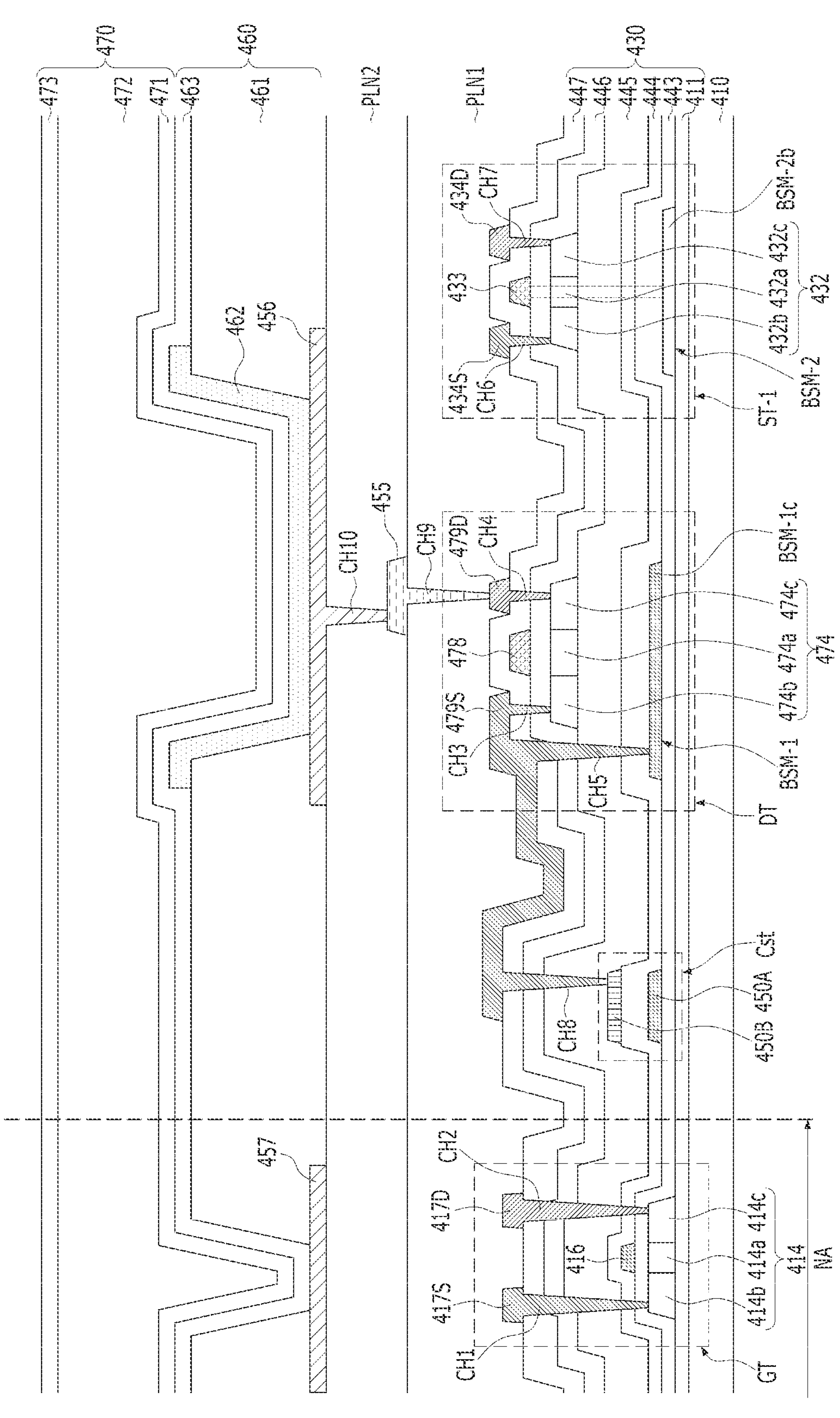
FIG. 12 is a cross-sectional view showing a display device according to another exemplary embodiment of the present disclosure.

FIG. 12 is a view showing a display device according to another exemplary embodiment of the present disclosure.

Referring to FIG. 12, configurations of a gate-driving thin film transistor GT and a storage capacitor Cst may be identical to those of the embodiment referring to FIG. 4A.

Accordingly, no detailed description of the gate-driving thin film transistor GT and the storage capacitor Cst will be given.

A first light shielding pattern BSM-1 may be disposed on a first gate insulating layer 443, together with a first gate electrode 416 of the gate-driving thin film transistor GT and a first electrode 450A of the storage capacitor Cst. Accordingly, the first light shielding pattern BSM-1, the first gate electrode 416 of the gate-driving thin film transistor GT, and the first electrode 450A of the storage capacitor Cst may be simultaneously formed using a single mask.

A second light shielding pattern BSM-2 may have a structure constituted by a single layer BSM-2*b* formed of a semiconductor material layer doped with impurity ions.

Figure 13:
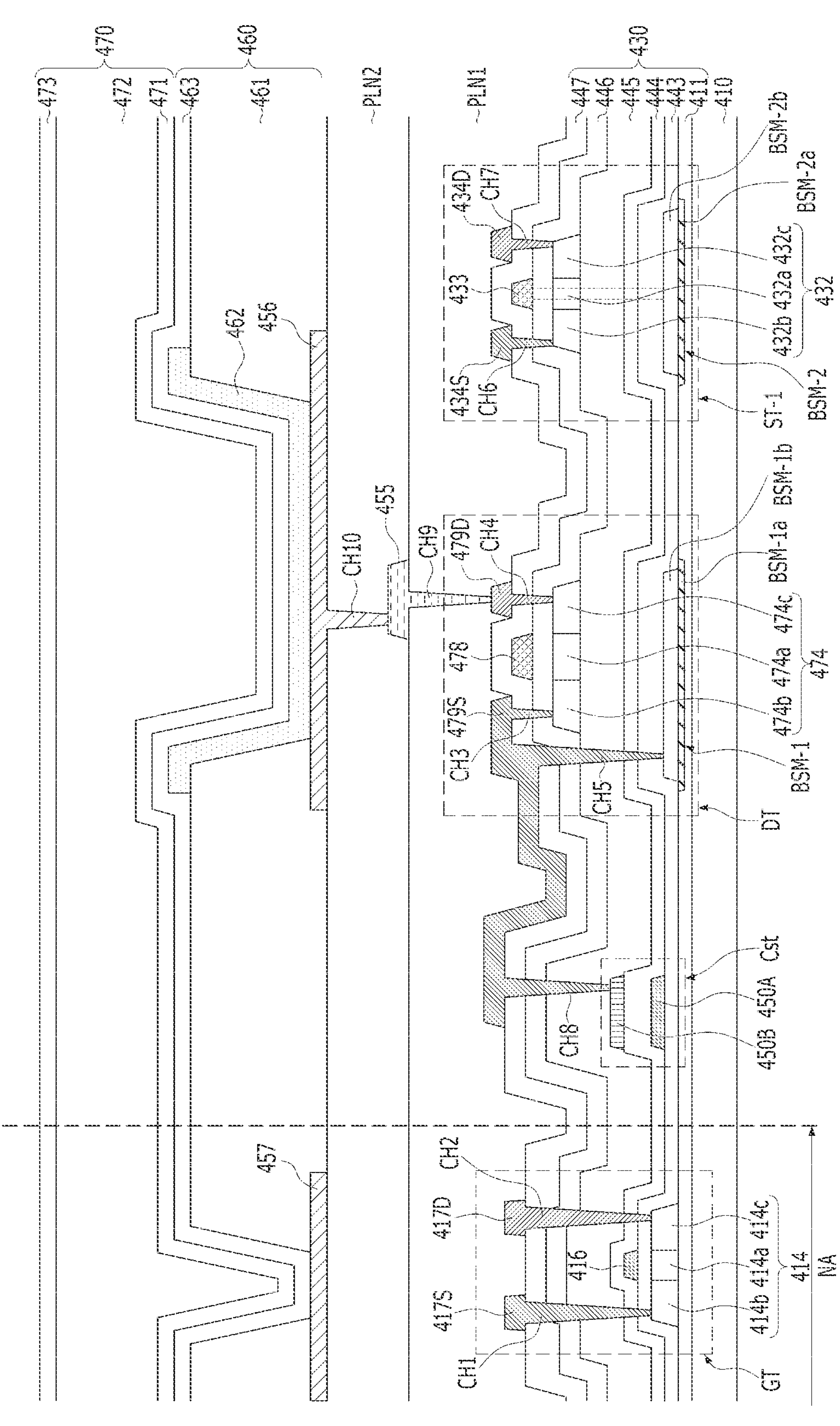
FIG. 13 is a cross-sectional view showing a display device according to another exemplary embodiment of the present disclosure.

FIG. 13 is a view showing a display device according to another exemplary embodiment of the present disclosure.

Referring to FIG. 13, configurations of a gate-driving thin film transistor GT and a storage capacitor Cst may be identical to those of the embodiment referring to FIG. 4A. Accordingly, no detailed description of the gate-driving thin film transistor GT and the storage capacitor Cst will be given.

A first layer BSM-la of a first light shielding pattern BSM-1 may be formed of a metal layer including a titanium (Ti) material capable of collecting hydrogen particles, and may be formed in a lower buffer layer 411.

In other words, after formation of the lower buffer layer 411, a portion of the lower buffer layer 411 may be removed to a predetermined depth, to form a groove, and the first layer BSM-la of the first light shielding pattern BSM-1 may be formed at the groove.

In this case, the height of the first layer BSM-la of the first light shielding pattern BSM-1 may be equal to the predetermined depth of the removed portion of the lower buffer layer 411. In this case, the height of a lower surface of a second layer BSM-lb constituted by a semiconductor material layer in the first light shielding pattern BSM-1 may be equal to the height of an upper surface of the lower buffer layer 411.

In addition, the width of the first layer BSM-la of the first light shielding pattern BSM-1 may be greater than the width of the second layer BSM-lb of the first light shielding pattern BSM-1. That is, the second layer BSM-lb of the first light shielding pattern BSM-1 may not contact the lower buffer layer 411.

A first layer BSM-2*a* of a second light shielding pattern BSM-2 may be formed of a metal layer including a titanium (Ti) material capable of collecting hydrogen particles, and may be formed in a lower buffer layer 411.

In other words, after formation of the lower buffer layer 411, a portion of the lower buffer layer 411 may be removed to a predetermined depth, to form a groove, and the first layer BSM-2*a* of the second light shielding pattern BSM-2 may be formed at the groove.

In this case, the height of the first layer BSM-2*a* of the second light shielding pattern BSM-2 may be equal to the predetermined depth of the removed portion of the lower buffer layer 411. In this case, the height of a lower surface of a second layer BSM-2*b* constituted by a semiconductor material layer in the second light shielding pattern BSM-2 may be equal to the height of the upper surface of the lower buffer layer 411.

In addition, the width of the first layer BSM-2*a* of the second light shielding pattern BSM-2 may be greater than the width of the second layer BSM-2*b* of the second light shielding pattern BSM-2. That is, the second layer BSM-2*b* of the second light shielding pattern BSM-2 may not contact the lower buffer layer 411.

When the first layer BSM-la of the first light shielding pattern BSM-1 and the first layer BSM-2*a* of the second light shielding pattern BSM-2 are formed in the lower buffer layer 411, as described above, there is an effect of reducing a step.

The display device according to each of the exemplary embodiments of the present disclosure may be explained as follows.

The display device according to the exemplary embodiment of the present disclosure may include a substrate including a display area and a non-display area disposed around the display area, an upper buffer layer disposed on the substrate while including at least one inorganic insulating layer, a first transistor disposed on the upper buffer layer while including a first semiconductor pattern and a first gate electrode disposed on the first semiconductor pattern, and a first light shielding pattern disposed between the substrate and the first transistor while including a metal layer or P-type impurity ions.

In the display device according to the exemplary embodiment of the present disclosure, the first transistor may include a first oxide semiconductor pattern, a first gate electrode overlapping with the first oxide semiconductor pattern, and a first source electrode and a first drain electrode electrically connected to the first oxide semiconductor pattern. The first light shielding pattern may be electrically connected to one of the first source electrode and the first drain electrode.

The display device according to the exemplary embodiment of the present disclosure may further include a second transistor disposed adjacent to the first transistor. The second transistor may include a second oxide semiconductor pattern disposed on the upper buffer layer, a second gate electrode overlapping with the second oxide semiconductor pattern, and a second source electrode and a second drain electrode electrically connected to the second oxide semiconductor pattern. The second transistor may also include a second light shielding pattern overlapping with the second oxide semiconductor pattern while including a metal layer or P-type impurity ions.

In the display device according to the exemplary embodiment of the present disclosure, the second gate electrode and the second light shielding pattern may be electrically interconnected, thereby constituting a dual gate.

The display device according to the exemplary embodiment of the present disclosure may further include a third transistor disposed on the substrate. The third transistor may include a third oxide semiconductor pattern disposed on the upper buffer layer, a third gate electrode overlapping with the third oxide semiconductor pattern, a third source electrode and a third drain electrode electrically connected to the third oxide semiconductor pattern, and a third light shielding pattern overlapping with the third oxide semiconductor pattern.

The display device according to the exemplary embodiment of the present disclosure may further include a lower buffer layer including at least one insulating layer disposed on the substrate, and a fourth transistor. The fourth transistor may include a polycrystalline semiconductor pattern disposed on the lower buffer layer, a fourth gate electrode disposed on the polycrystalline semiconductor pattern while overlapping with the polycrystalline semiconductor pattern, and a fourth source electrode and a fourth drain electrode electrically connected to the polycrystalline semiconductor pattern.

In the display device according to the exemplary embodiment of the present disclosure, at least a portion of the first light shielding pattern may be formed of a material identical to that of the polycrystalline semiconductor pattern or the fourth gate electrode of the fourth transistor.

In the display device according to the exemplary embodiment of the present disclosure, at least one of the first light shielding pattern, the second light shielding pattern, and the third light shielding pattern may further include a metal pattern, and a semiconductor material layer may be stacked on the metal pattern.

In the display device according to the exemplary embodiment of the present disclosure, the second light shielding pattern may have a structure in which a metal pattern and a semiconductor material layer are stacked. The third light shielding pattern may be constituted only by a metal pattern.

In the display device according to the exemplary embodiment of the present disclosure, the first light shielding pattern and the second light shielding pattern may be disposed on the same layer.

In the display device according to the exemplary embodiment of the present disclosure, the first transistor may be a driving thin film transistor configured to drive a pixel, and each of the second transistor and the third transistor may be a switching thin film transistor.

In the display device according to the exemplary embodiment of the present disclosure, the fourth transistor may be disposed in at least one of the non-display area and the display area, and the first transistor may be disposed at a pixel of the display area.

In the display device according to the exemplary embodiment of the present disclosure, the semiconductor material layer may have a reflectivity lower than that of the metal pattern.

In the display device according to the exemplary embodiment of the present disclosure, the polycrystalline semiconductor pattern and the semiconductor material layer may be doped with P-type impurity ions.

In the display device according to the exemplary embodiment of the present disclosure, the lower buffer layer has a groove, and may include a metal layer disposed in the groove.

The display device according to the exemplary embodiment of the present disclosure may include a substrate including a display area and a non-display area disposed around the display area, a lower buffer layer disposed on the substrate while including at least one insulating layer, a first transistor disposed on the lower buffer layer while including a first semiconductor pattern and a first gate electrode disposed on the first semiconductor pattern, an upper buffer layer disposed to cover the first transistor while including at least one inorganic insulating layer, a second transistor disposed on the upper buffer layer while including a second semiconductor pattern and a second gate electrode disposed on the second semiconductor pattern, and a second light shielding pattern disposed between the substrate and the second transistor while including a metal layer or P-type impurity ions.

As apparent from the above description, a pixel of the display device according to each of the exemplary embodiments of the present disclosure includes a driving thin film transistor and a switching thin film transistor, thereby blocking leakage current in an off state. Accordingly, a reduction in power consumption may be achieved. In addition, the driving thin film transistor may have a structure capable of increasing an s-factor and, as such, a thin film transistor array substrate capable of achieving free grayscale expression at low gray levels may be provided. In addition, a thin film transistor capable of increasing a threshold voltage of the driving thin film transistor in the pixel may be provided. Furthermore, a plurality of switching thin film transistors disposed in the pixel may have different threshold voltages, respectively, and, as such, each switching thin film transistor may have suitable characteristics.

Effects of the present disclosure are not limited to the above-described effects. Other effects not described in the present disclosure may be readily understood by those skilled in the art from the appended claims.

It will be appreciated that the technical spirit of the present disclosure has been described herein only for purposes of illustration through the above description and the accompanying drawings, and that combination, separation, substitution, and modifications of components may be made by those skilled in the art without departing from the scope and spirit of the present disclosure. Therefore, the exemplary embodiments of the present disclosure are provided for illustrative purposes only and are not intended to limit the technical spirit of the present disclosure. The scope of the technical spirit of the present disclosure is not limited thereto. The protection scope of the present disclosure should be interpreted based on the appended claims, and it should be appreciated that all technical ideas falling within a range equivalent to the claims are included in the protection scope of the present disclosure.

What is claimed is:

1. A display device comprising:

a substrate including a display area and a non-display area around the display area;

an upper buffer layer on the substrate, the upper buffer layer including at least one inorganic insulating layer;

a first transistor on the upper buffer layer, the first transistor including a first semiconductor pattern and a first gate electrode on the first semiconductor pattern; and a first light shielding pattern between the substrate and the first transistor, the first light shielding pattern including a semiconductor material layer doped with P-type impurity ions.

2. The display device according to claim 1, wherein the first transistor includes a first oxide semiconductor pattern, a first gate electrode overlapping the first oxide semiconductor pattern, and a first source electrode and a first drain electrode, each of the first source electrode and the first drain electrode electrically connected to the first oxide semiconductor pattern, wherein the first light shielding pattern is electrically connected to one of the first source electrode and the first drain electrode.

3. The display device according to claim 2, further comprising:

a second transistor adjacent to the first transistor, the second transistor including a second oxide semiconductor pattern on the upper buffer layer, a second gate electrode overlapping the second oxide semiconductor pattern, and a second source electrode and a second drain electrode, each of the second source electrode and the second drain electrode electrically connected to the second oxide semiconductor pattern, and wherein the second transistor further includes a second light shielding pattern overlapping the second oxide semiconductor pattern, the second light shielding pattern including a metal layer or P-type impurity ions.

4. The display device according to claim 3, wherein the second gate electrode and the second light shielding pattern are electrically interconnected, thereby constituting a dual gate.

5. The display device according to claim 3, further comprising:

a third transistor on the substrate, the third transistor comprising:

a third oxide semiconductor pattern on the upper buffer layer;

a third gate electrode overlapping the third oxide semiconductor pattern;

a third source electrode and a third drain electrode, each of the third source electrode and the third drain electrode electrically connected to the third oxide semiconductor pattern; and a third light shielding pattern overlapping the third oxide semiconductor pattern.

6. The display device according to claim 5, further comprising:

a lower buffer layer including at least one insulating layer disposed on the substrate; and a fourth transistor, the fourth transistor comprising:

a polycrystalline semiconductor pattern on the lower buffer layer;

a fourth gate electrode on the polycrystalline semiconductor pattern, the fourth gate electrode overlapping the polycrystalline semiconductor pattern; and a fourth source electrode and a fourth drain electrode, each of the fourth source electrode and the fourth drain electrode electrically connected to the polycrystalline semiconductor pattern.

7. The display device according to claim 6, wherein at least a portion of the first light shielding pattern comprises a same material as the polycrystalline semiconductor pattern or the fourth gate electrode of the fourth transistor.

8. The display device according to claim 6, wherein at least one of the first light shielding pattern, the second light shielding pattern, and the third light shielding pattern includes a metal pattern and a semiconductor material layer is stacked on the metal pattern.

9. The display device according to claim 8, wherein the second light shielding pattern has a stacked structure of a metal pattern and a semiconductor material layer, and the third light shielding pattern is constituted by a metal pattern.

10. The display device according to claim 3, wherein the first light shielding pattern and the second light shielding pattern are on a same layer.

11. The display device according to claim 5, wherein the first transistor is a driving thin film transistor configured to drive a pixel, and each of the second transistor and the third transistor is a switching thin film transistor.

12. The display device according to claim 6, wherein the fourth transistor is in at least one of the non-display area and the display area, and the first transistor is at a pixel of the display area.

13. The display device according to claim 8, wherein the semiconductor material layer has a reflectivity that is less than a reflectivity of the metal pattern.

14. The display device according to claim 8, wherein the polycrystalline semiconductor pattern and the semiconductor material layer are doped with P-type impurity ions.

15. The display device according to claim 6, wherein the lower buffer layer has a groove, and includes a metal layer in the groove.

16. A display device comprising:

a substrate including a display area and a non-display area disposed around the display area;

a lower buffer layer on the substrate, the lower buffer layer including at least one insulating layer;

a first transistor on the lower buffer layer, the first transistor including a first semiconductor pattern and a first gate electrode on the first semiconductor pattern;

an upper buffer layer covering the first transistor, the upper buffer layer including at least one inorganic insulating layer;

a second transistor on the upper buffer layer, the second transistor including a second semiconductor pattern and a second gate electrode on the second semiconductor pattern; and a second light shielding pattern between the substrate and the second transistor, the second light shielding pattern including a semiconductor material layer doped with P-type impurity ions.

* * * * *